US012811832B2

(12) United States Patent
Choi et al.

(10) Patent No.: US 12,811,832 B2
(45) Date of Patent: Nov. 24, 2026

(54) PAM3 TRANSMITTER, OPERATING METHOD OF PAM3 TRANSMITTER AND ELECTRONIC DEVICE INCLUDING THE SAME

(71) Applicant: Samsung Electronics Co., Ltd., Suwon-si (KR)

(72) Inventors: Moon-Chul Choi, Suwon-si (KR); Sung-Yong Cho, Suwon-si (KR); Hyeran Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 18/912,862

(22) Filed: Oct. 11, 2024

(65) Prior Publication Data

US 2025/0184191 A1 Jun. 5, 2025

(30) Foreign Application Priority Data

Nov. 30, 2023 (KR) ........................ 10-2023-0171814

(51) Int. Cl.

*H04L 25/49* (2006.01)
*H03K 3/017* (2006.01)
*H03K 5/156* (2006.01)
*H03K 7/02* (2006.01)
*H04L 27/04* (2006.01)

(52) U.S. Cl.

CPC ......... *H04L 25/4917* (2013.01); *H03K 3/017* (2013.01); *H03K 5/1565* (2013.01); *H03K 7/02* (2013.01); *H04L 27/04* (2013.01)

(58) Field of Classification Search

CPC ........ H03K 3/017; H03K 5/1565; H03K 7/02; H04B 1/02; H04B 1/04; H04B 1/04083; H04B 10/0795; H04B 10/524; H04B 10/541; H04B 2021/0408; H04L 25/026; H04L 25/4917; H04L 27/02; H04L 27/04

USPC ....... 375/286, 295, 297, 298, 300, 353, 364; 332/106, 115, 116, 149, 150, 154, 162, 332/180; 455/91, 108, 114.3, 115.2, 455/127.1

See application file for complete search history.

(56) References Cited

U.S. PATENT DOCUMENTS 7,218,832 B2 5/2007 Ghiggino et al.
7,705,647 B2 * 4/2010 Dai ...................... H03K 5/1565 327/170
8,933,738 B2 * 1/2015 Wu ...................... H03K 5/1565 327/261

(Continued)

FOREIGN PATENT DOCUMENTS

KR 102349415 B1 1/2022
KR 1020220063953 A 5/2022
KR 1020230064847 A 5/2023

*Primary Examiner* — Young T. Tse

(74) *Attorney, Agent, or Firm* — Wolf, Greenfield & Sacks, P.C.

(57) ABSTRACT

Provided are a 3 level pulse amplitude modulation (PAM3) transmitter, an operating method of the PAM3 transmitter, and an electronic device including the same. The PAM3 transmitter includes a driver configured to convert input data into PAM3 signals, an eye monitor circuit electrically connected to an output terminal of the driver and configured to monitor upper eye patterns and lower eye patterns of the PAM3 signals, and a duty cycle adjust circuit configured to adjust a duty cycle of the input data provided to the driver.

20 Claims, 20 Drawing Sheets

10b

(56) References Cited

U.S. PATENT DOCUMENTS

| | | | | |
|---|---|---|---|---|
| 9,667,281 | B1 | 5/2017 | Venditti et al. | |
| 10,312,896 | B2 | 6/2019 | Kim et al. | |
| 11,409,354 | B2 | 8/2022 | Brox et al. | |
| 11,700,012 | B2 | 7/2023 | Ko et al. | |
| 2007/0159224 | A1* | 7/2007 | Dwarka | H03K 5/1565 327/175 |
| 2017/0207946 | A1* | 7/2017 | Dickson | H04L 27/364 |
| 2018/0316527 | A1 | 11/2018 | Li et al. | |
| 2022/0286329 | A1 | 9/2022 | Navid | |
| 2023/0075962 | A1* | 3/2023 | Kang | G11C 7/1048 |
| 2023/0138845 | A1 | 5/2023 | Kim et al. | |
| 2023/0353338 | A1* | 11/2023 | Kushnir | H04L 7/0016 |

* cited by examiner

PAM3 TRANSMITTER, OPERATING METHOD OF PAM3 TRANSMITTER AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2023-0171814, filed on Nov. 30, 2023, in the Korean Intellectual Property Office, the disclosure of which is incorporated by reference herein in its entirety.

BACKGROUND

The inventive concept relates to an electronic device, and more particularly, to a 3 level pulse amplitude modulation (PAM3) transmitter, an operating method of the PAM3 transmitter, and an electronic device including the same.

As the operating speed of a system including semiconductor devices becomes faster and technology for semiconductor integrated circuits has been developed, semiconductor memory devices may be required to output or store data at higher speed. Thus, synchronous memory devices capable of inputting/outputting data while being synchronized with an input system clock to input/output data at high speed have been developed. However, it may not be enough to satisfy a required data input/output speed even with a synchronous memory device, so that double data rate (DDR) synchronous memory devices in which data are input/output to/from the DDR memory devices on each of a rising edge and a falling edge of a system clock, have been developed.

In recent years, pulse amplitude modulation (PAM) methods have been actively studied to satisfy the requirements for high capacity and high-speed data transmission. In communication, an interconnection between a transmitter and a receiver, that is, a channel may distort signals. To compensate for the distortion of signals generated from the channel, the transmitter may use a circuit for performing an eye monitoring operation.

SUMMARY

Embodiments of the inventive concept provide a 3 level pulse amplitude modulation (PAM3) transmitter that outputs PAM3 signals of which distortion is compensated for by adjusting a duty cycle of an input data signal to a driver by feeding back the PAM3 signals and monitoring eye patterns, an operating method of the PAM3 transmitter, and an electronic device including the same.

According to an aspect of the inventive concept, there is provided a PAM3 transmitter including a driver configured to convert input data into PAM3 signals, an eye monitor circuit electrically connected to an output terminal of the driver and configured to monitor upper eye patterns and lower eye patterns of the PAM3 signals, and a duty cycle adjust circuit configured to adjust a duty cycle of the input data provided to the driver.

According to another aspect of the inventive concept, there is provided an electronic device including a PAM3 transmitter and a PAM3 receiver, wherein the PAM3 transmitter includes a serializer configured to receive data and to convert the received data into serial data, a duty cycle adjust circuit configured to receive pull-up enable signals, pull-down enable signals, and the serial data and to output input data in response thereto, a driver configured to convert the input data into PAM3 signals, and an eye monitor circuit electrically connected to an output terminal of the driver and configured to monitor upper eye patterns and lower eye patterns of the PAM3 signals and to generate duty cycle adjust signals in response thereto, wherein the duty cycle adjust circuit is further configured to output the input data of which a duty cycle is adjusted, based on the duty cycle adjust signals.

According to another aspect of the inventive concept, there is provided an operating method of a PAM3 transmitter, the operating method including receiving data and converting the received data into input data that comprises serial data, converting the input data into PAM3 signals, monitoring upper eye patterns and lower eye patterns of the PAM3 signals, determining whether the upper eye patterns and the lower eye patterns of the PAM3 signals are asymmetric to each other, and adjusting a duty cycle of the input data based on whether the upper eye patterns and the lower eye patterns of the PAM3 signals are asymmetric to each other.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
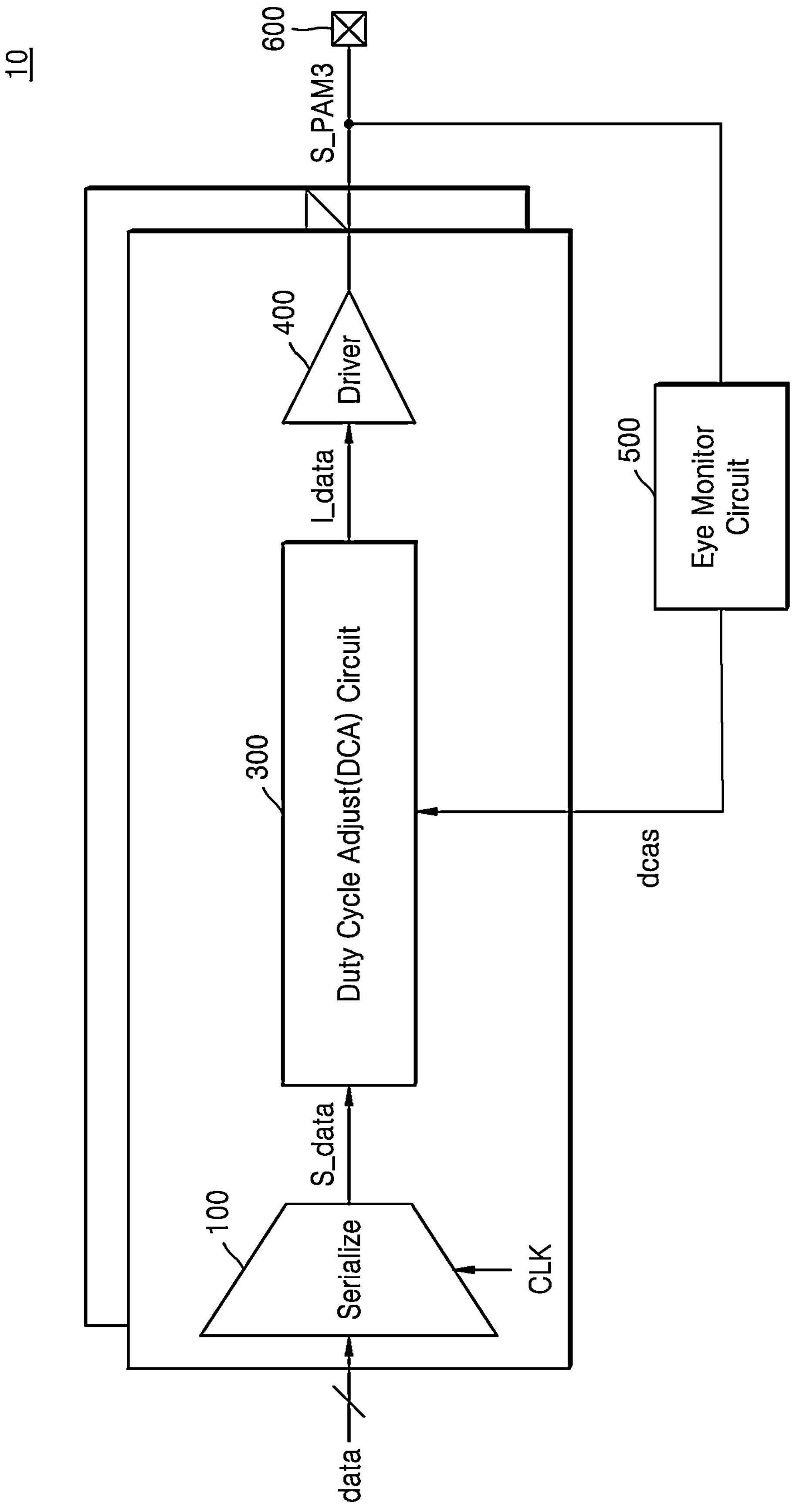
FIGS. 1A and 1B are block diagrams illustrating a 3 level pulse amplitude modulation (PAM3) transmitter according to an embodiment.

Hereinafter, embodiments of the inventive concept will be described in detail with reference to the accompanying drawings. Identical reference numerals are used for the same constituent elements in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1B:
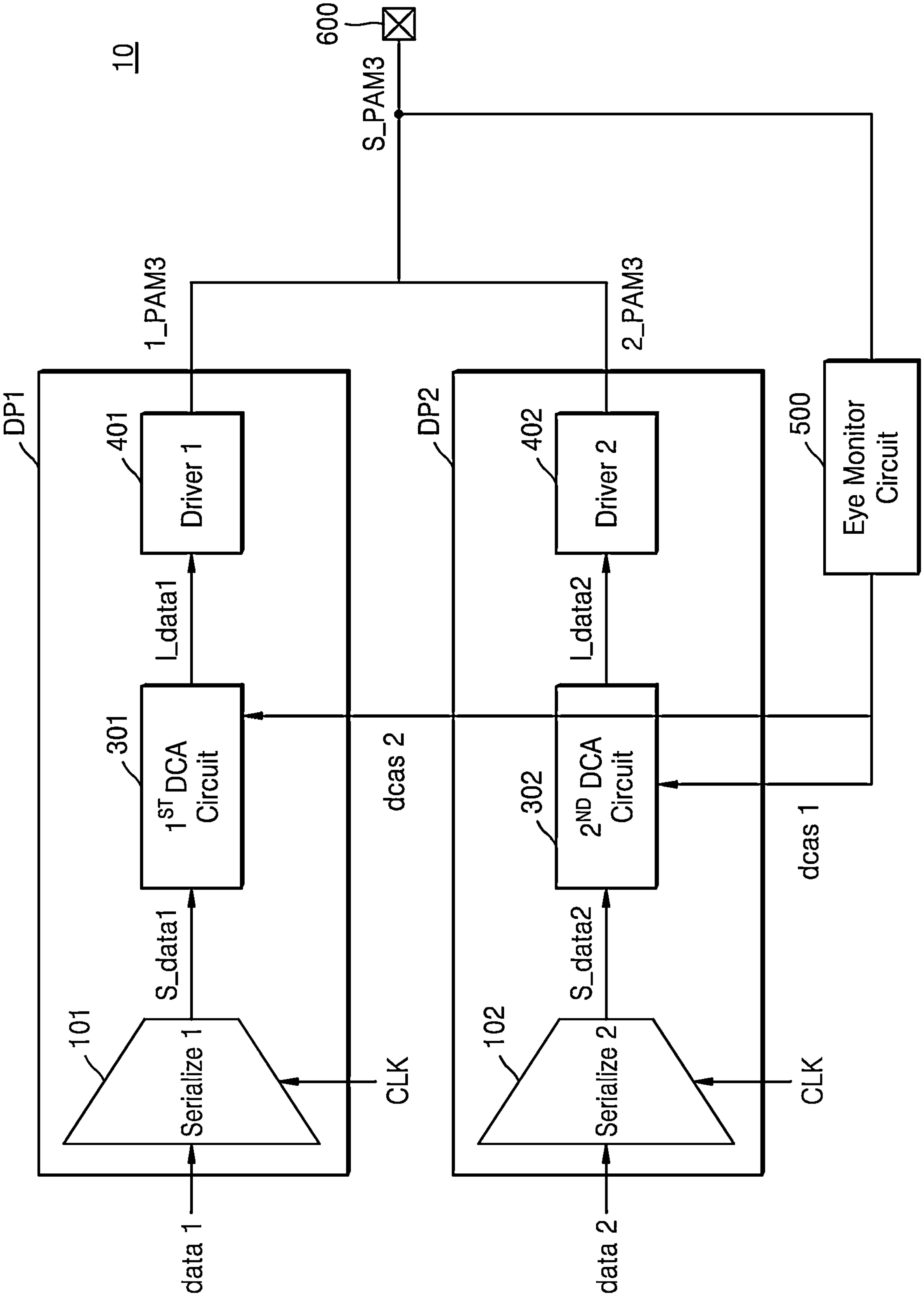

FIGS. 1A and 1B are block diagrams illustrating a 3 level pulse amplitude modulation (PAM3) transmitter 10 according to an embodiment.

Referring to FIG. 1A, the PAM3 transmitter 10 may include a serializer 100, a duty cycle adjust (DCA) circuit 300, a driver 400, an eye monitor circuit 500, and an output pad 600.

The PAM3 transmitter 10 may be a transmitter configured to transmit signals modulated according to N-level pulse amplitude modulation (hereinafter, referred to as PAM-N, where N is a natural number that is greater than or equal to 3). For example, the PAM3 transmitter 10 may transmit/receive signals by using a PAM3 method. The PAM3 transmitter 10 may generate PAM3 signals S_PAM3 that may be represented by loading 3-bit data on 2 symbols with 3 levels, and may output the generated PAM3 signals S_PAM3 through the output pad 600. A method of generating PAM3 signals S_PAM3 by using the PAM3 transmitter 10 is described with reference to FIG. 1B and/or FIG. 2.

A PAM-N method may be a modulation method for transmitting a plurality of bits during one unit interval. Here, the unit interval may correspond to a symbol cycle for transmitting signals of one symbol. For example, when data is modulated by using the PAM-N method, a plurality of data bit information may be included in one symbol. Hereinafter, embodiments of the present disclosure are described based on the PAM3 method.

In some embodiments, when transmitting PAM3 signals S_PAM3, the PAM3 transmitter 10 may be configured to sufficiently secure an eye opening height and an eye opening width of the PAM3 signals S_PAM3, and simultaneously, may be configured to consume power efficiently.

The PAM3 transmitter 10 according to some embodiments of the inventive concept may have enhanced linearity and may monitor the PAM3 signals S_PAM3 by using the eye monitor circuit 500, and the DCA circuit 300 may output PAM3 signals S_PAM3 in which a sufficient eye opening height and a sufficient eye opening width are secured.

The serializer 100 may convert data into serial data S_data having a continuous data column format. The serializer 100 may convert data into serial data S_data in response to clock signals CLK received from an external source. That is, the serializer 100 may convert data received through a databus into serial data S_data. For example, the serial data S_data may include a series of symbols each having a unit interval (UI). Here, the data may be provided from a processor or baseband units, such as various data processing blocks. The serial data S_data may be output by the serializer 100 in the form of 2 consecutive bits.

The DCA circuit 300 may output input data I_data by receiving the serial data S_data. The DCA circuit 300 may receive pull-up enable signals (ENPU of FIG. 3) and pull-down enable signals (ENPD of FIG. 3), which are generated from an external source. A computational method for generating the pull-up enable signals ENPU and the pull-down enable signals ENPD of the DCA circuit 300 may vary depending on the configuration of a driver 400.

The driver 400 may receive the input data I_data output from the DCA circuit 300. The driver 400 may convert the input data I_data into PAM3 signals S_PAM3. The driver 400 may generate PAM3 signals S_PAM3 corresponding to the input data I_data. The driver 400 may output the generated PAM3 signals S_PAM3 through the output pad 600. An output terminal of the driver 400 may be connected to the eye monitor circuit 500.

The eye monitor circuit 500 may monitor first eye patterns and second eye patterns of the PAM3 signals S_PAM3 output by the driver 400. For example, the first eye patterns may be upper eye patterns of the PAM3 signals S_PAM3, and the second eye patterns may be lower eye patterns of the PAM3 signals S_PAM3. The eye monitor circuit 500 may check whether skew occurs in the eye patterns, by monitoring the eye opening height and the eye opening width of the PAM3 signals S_PAM3. For example, the eye monitor circuit 500 may compare the size of the upper eye patterns of the PAM3 signals S_PAM3 with the size of the lower eye patterns of the PAM3 signals S_PAM3. When the size of the upper eye patterns and the size of the lower eye patterns are different from each other, duty cycle adjust signals dcas may be generated and provided to the DCA circuit 300.

The DCA circuit 300 may receive the duty cycle adjust signals dcas generated by the eye monitor circuit 500. The DCA circuit 300 may adjust a duty cycle of the serial data S_data. When the eye monitoring circuit 500 compares the first eye patterns with the second eye patterns and there are an asymmetric comparison, the DCA circuit 300 may adjust the duty cycle of the input data I_data provided to the driver 400, and the driver 400 may receive the input data I_data of which the duty cycle is adjusted. A method of adjusting the duty cycle of the input data I_data by using the DCA circuit 300 is described below with reference to FIG. 7.

The DCA circuit 300 may adjust the duty cycle of the serial data S_data to generate input data I_data with the adjusted duty cycle, which is provided to the driver 400, thereby outputting PAM3 signals in which upper eye characteristics and lower eye characteristics of the PAM3 signals S_PAM3 are enhanced. Thus, a DCA circuit 300, according to some embodiments, may adjust the duty cycle of the input data I_data that is provided to the driver 400 by adjusting the duty cycle of the serial data S_data and generating the input data I_data as the serial data S_data with an adjusted duty cycle. Thus, the input data I_data comprises the serial data S_data with a duty cycle adjustment applied to the serial data S_data.

The DCA circuit 300 may generate the input data I_data with an adjusted duty cycle, which is provided to the driver 400 so that the size of the upper eye patterns and the size of the lower eye patterns are equal to each other. For example, the DCA circuit 300 may adjust heights of the upper eye patterns and the lower eye patterns/or widths of the eye opening patterns.

Referring to FIG. 1B, the PAM3 transmitter 10 may include a first data path DP1, a second data path DP2, an eye monitor circuit 500, and an output pad 600. The first data path DP1 may include a first serializer 101, a first DCA circuit 301, and a first driver 401. The second data path DP2 may include a second serializer 102, a second DCA circuit 302, and a second driver 402.

Referring to FIG. 1B, the serializer 100, the DCA circuit 300, the driver 400, and the eye monitor circuit 500 of FIG. 1A may be arranged in parallel and may represent the PAM3 transmitter 10 for outputting the PAM3 signals S_PAM3.

For example, the serializer 100 of FIG. 1A may include a first serializer 101 and a second serializer 102, and the DCA circuit 300 of FIG. 1A may include a first DCA circuit 301 and a second DCA circuit 302, and the driver 400 of FIG. 1A may include a first driver 401 and a second driver 402, and the data of FIG. 1A may include first data data1 and second data data2, and the serial data S_data of FIG. 1A may include first serial data S_data1 and second serial data S_data2, and the input data I_data of FIG. 1A may include first input data I_data1 and second input data I_data2, and the PAM3 signals S_PAM3 of FIG. 1A may include first PAM3 signals 1_PAM3 and second PAM3 signals 2_PAM3.

The first serializer 101 may convert the first data data1 into the first serial data S_data1 having a continuous data column form in response to the clock signals CLK received from the outside.

The first DCA circuit 301 may output the first input data I_data1 by receiving the first serial data S_data1. The first DCA circuit 301 may generate the first input data I_data1 having an adjusted duty cycle responsive to receiving the first serial data S_data1 and the duty cycle adjust signal dcas generated by the eye monitor circuit 500.

The first driver 401 may output first PAM3 signals 1_PAM3 responsive to receiving the first input data I_data1. The first driver 401 may convert the first input data I_data1 into the first PAM3 signals 1_PAM3. The first driver 401 may generate the first PAM3 signals 1_PAM3 corresponding to the first input data I_data1.

The second serializer 102 may convert the first data data1 into the second serial data S_data2 having a continuous data column form in response to the clock signals CLK received from the outside.

The second DCA circuit 302 may output the second input data I_data2 by receiving the second serial data S_data2. The second DCA circuit 302 may generate the second input data I_data2 having an adjusted duty cycle responsive to receiving the second serial data S_data2 and the duty cycle adjust signals dcas generated by the eye monitor circuit 500.

The second driver 402 may output second PAM3 signals 2_PAM3 responsive to receiving the first input data I_data1. The second driver 402 may convert the second input data I_data2 into the second PAM3 signals 2_PAM3. The second driver 402 may generate the second PAM3 signals 2_PAM3 corresponding to the second input data I_data2.

The first data path DP1 may output the first PAM3 signals 1_PAM3, and the second data path DP2 may output the second PAM3 signals 2_PAM3. The output pad 600 may merge the first PAM3 signals 1_PAM3 with the second PAM3 signals 2_PAM3 to output PAM3 signals S_PAM3.

Figure 2:
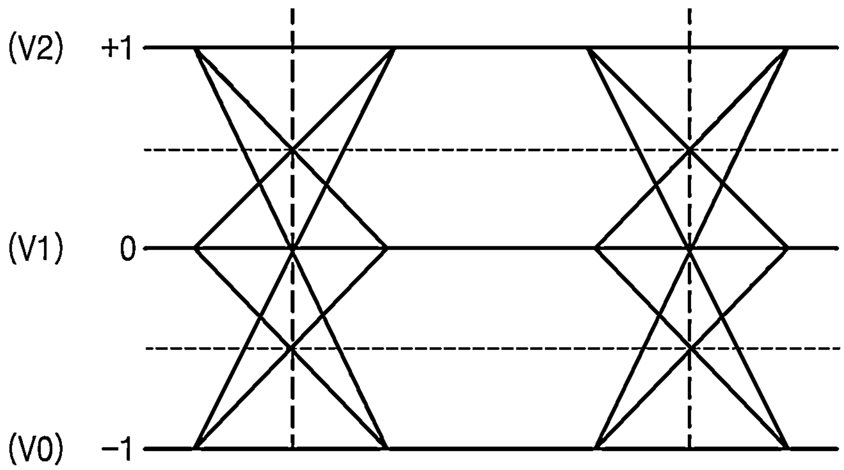
FIG. 2 is a diagram that illustrates PAM3 signal levels based on the PAM3 transmitter according to an embodiment.

FIG. 2 is a diagram that illustrates PAM3 signal levels based on the PAM3 transmitter according to an embodiment.

FIG. 2 illustrates voltage levels of the PAM3 signals S_PAM3 based on PAM3 having three voltage levels. However, this is an embodiment presupposed for convenience of description, and embodiments are not limited thereto, and it will be sufficiently understood that embodiments of the disclosure may be applied to levels of data signals based on PAMn having n or more levels.

Referring to FIG. 2, the PAM3 signals S_PAM3 may be mapped to a lowest first level V0, an intermediate level second level V1, and a highest third level V2. Also, in eye patterns of the PAM3 signals S_PAM3, signals of the output PAM3 signaling method may support three levels and may transmit 3-bit data to two symbols. For example, in the PAM3 signal method, three levels may result in two eye diagrams.

Referring to FIGS. 1B and 2, for example, when the first PAM3 signals 1_PAM3 are '0' and the second PAM3 signals 2_PAM3 are '0', the PAM3 signals S_PAM3 may be mapped to the lowest first level V0. When the first PAM3 signals 1_PAM3 are 'O' and the second PAM3 signals 2_PAM3 are 'l', the PAM3 signals S_PAM3 may be mapped to the second level V1 that is an intermediate level, and when the first PAM3 signals 1_PAM3 are 'l' and the second PAM3 signals 2_PAM3 are '0', the PAM3 signals S_PAM3 may be mapped to the second level V1 that is the intermediate level. When the first PAM3 signals 1_PAM3 are 'l' and the second PAM3 signals 2_PAM3 are 'l', the PAM3 signals S_PAM3 may be mapped to the highest third level V2.

In the present specification, for the convenience of description, the embodiments of the disclosure are described based on the level example of the PAM3 signals S_PAM3 shown in FIG. 2. Mapping between the PAM3 signals S_PAM3 and the levels V0 to V2 may vary depending on a code method, and it will be understood that embodiments of the disclosure may be applied to the PAM3 signals S_PAM3 by using different code methods.

Figure 3A:
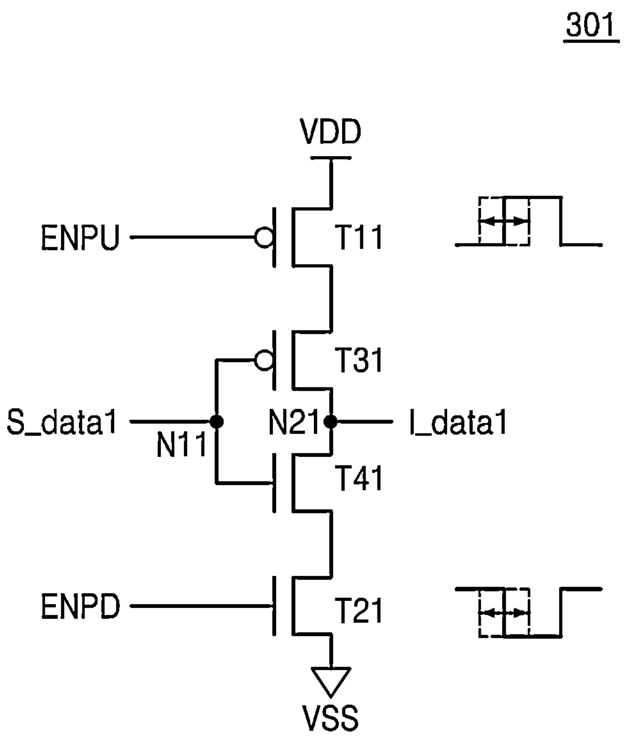
FIGS. 3A and 3B are circuit diagrams of a duty cycle adjust (DCA) circuit according to an embodiment.
Figure 3B:
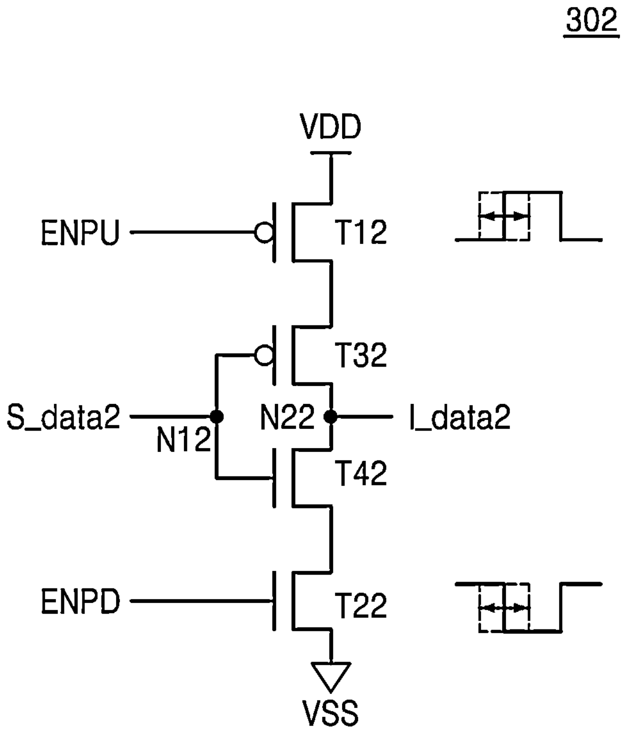

FIGS. 3A and 3B are circuit diagrams illustrating DCA circuits 301 and 302 according to an embodiment.

Referring to FIG. 3A, the first DCA circuit 301 may include a first transistor T11, a second transistor T21, a third transistor T31, and a fourth transistor T41.

A power supply voltage VDD may be applied to one end of a first transistor T11, and the other end of the first transistor T11 may be electrically connected to a third transistor T31. One end of the second transistor T21 may be connected to the fourth transistor T41, and a ground voltage VSS may be applied to the other end of the second transistor T21.

A gate terminal of a third transistor T31 and a gate terminal of a fourth transistor T41 may be electrically connected to a first node N11, and one end of the third transistor T31 may be electrically connected to the first transistor T11, and the other end of the third transistor T31 may be electrically connected to a second node N21. One end of the fourth transistor T41 may be electrically connected to the second node N21, and the other end of the fourth transistor T41 may be electrically connected to the second transistor T21.

A gate of the first transistor T11 may receive pull-up enable signals ENPU. For example, the first transistor T11 may control a rising edge of the input data I_data based on the pull-up enable signals ENPU. A gate of the second transistor T11 may receive pull-down enable signals ENPD. For example, the second transistor T21 may control a falling edge of the input data I_data based on the pull-down enable signals ENPD. A method of controlling the rising edge and the falling edge of the first input data I_data1 based on changing of voltage levels of the pull-up enable signals ENPU input to the gate terminal of the first transistor T11 and the pull-down enable signals ENPD input to the second transistor T21 will be described below with reference to FIG. 7.

The first node N11 may receive the first serial data S_data1 output from the serializer (101 of FIG. 1B). The second node N21 may output the first input data I_data1.

The first transistor T11 and the third transistor T31 may include P-channel metal oxide semiconductor (PMOS) transistors, and the second transistor T21 and the fourth transistor T4 may include N-channel metal oxide semiconductor (NMOS) transistors.

Referring to FIG. 3B, the second DCA circuit 302 may include a first transistor T12, a second transistor T22, a third transistor T32, and a fourth transistor T42.

A power supply voltage VDD may be applied to one end of the second transistor T21, and the other end of the first transistor T12 may be electrically connected to the third transistor T32. One end of the second transistor T22 may be electrically connected to the fourth transistor T42, and a ground voltage VSS may be applied to the other end of the second transistor T22.

A gate terminal of the third transistor T32 and a gate terminal of a fourth transistor T42 may be electrically connected to the first node N11, and one end of the third transistor T32 may be electrically connected to the first transistor T21, and the other end of the third transistor T31 may be electrically connected to a second node N21. One end of the first transistor T42 may be electrically connected to the second node N21, and the other end of the fourth transistor T42 may be electrically connected to the second transistor T21.

A gate of the first transistor T12 may receive pull-up enable signals ENPU. For example, the first transistor T12 may control a rising edge of the second input data I_data2 based on the pull-up enable signals ENPU. A gate of the second transistor T21 may receive pull-down enable signals ENPD. For example, the second transistor T21 may control a falling edge of the second input data I_data2 based on the pull-down enable signals ENPD. A method of controlling the rising edge and the falling edge of the second input data I_data12 based on changing of voltage levels of the pull-up enable signals ENPU input to the gate terminal of the first transistor T12 and the pull-down enable signals ENPD input to the second transistor T22 will be described below with reference to FIG. 7.

The first node N12 may receive the second serial data S_data2 output from the serializer (102 of FIG. 1B). The second node N21 may output the second input data I_data2.

The first transistor T12 and the third transistor T32 may include PMOS transistors, and the second transistor T22 and the fourth transistor T42 may include NMOS transistors.

Figure 4A:
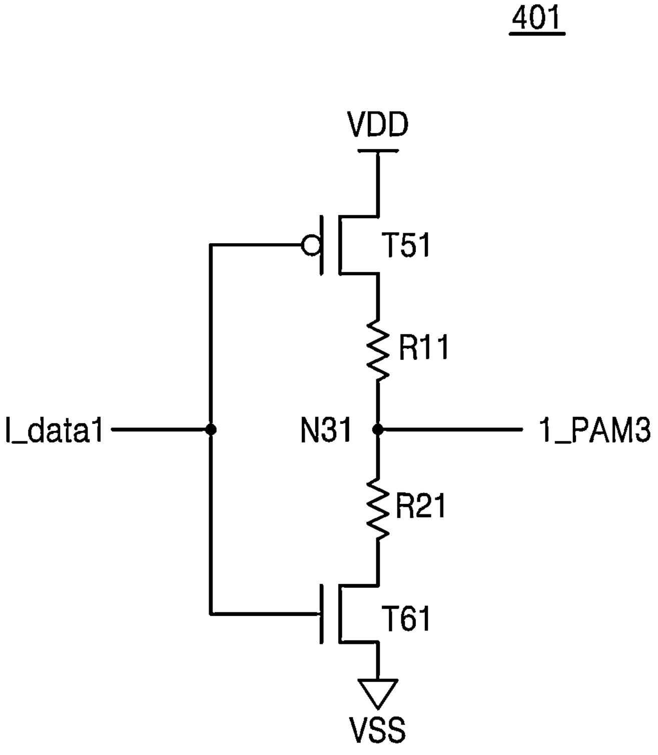
FIGS. 4A and 4B are circuit diagrams of a driver according to an embodiment.
Figure 4B:
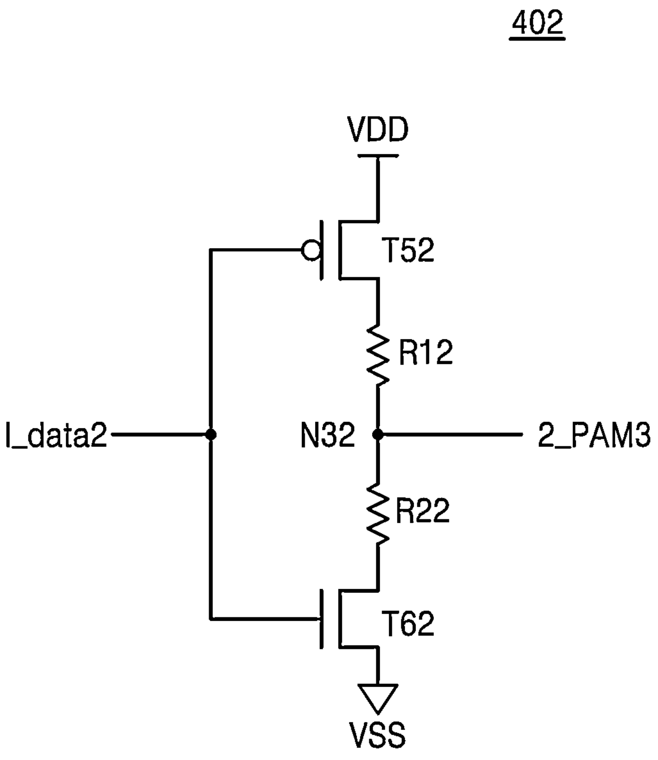

FIGS. 4A and 4B are circuit diagrams illustrating drivers 401 and 402 according to an embodiment.

Referring to FIG. 4A, the first driver 401 may include a first transistor T51, a second transistor T61, a first resistor R11, and a second resistor R21.

A power supply voltage VDD may be applied to one end of a first transistor T51, and the other end of the first transistor T51 may be electrically connected to the first resistor R11. One end of the second transistor T61 may be electrically connected to the second resistor R21, and a ground voltage VSS may be applied to the other end of the second transistor T61.

One end of the first resistor R11 may be electrically connected to the first transistor T51, and the other end of the first resistor R11 may be electrically connected to the first node N31. One end of the second resistor R21 may be electrically connected to the third node N31, and the other end of the second resistor R21 may be electrically connected to the second transistor T61.

A gate of the first transistor T51 and a gate of the second transistor T61 may receive the first input data I_data1. The first node N31 may output first PAM3 signals 1_PAM3. For example, the first transistor T51 and the second transistor T61 of the first driver 401 may control a rising edge or falling edge of the first PAM3 signals 1_PAM3.

The first transistor T51 may include a PMOS transistor, and the second transistor T61 may include a NMOS transistor. The first resistor R11 and the second resistor R21 may be voltage distribution resistors.

Referring to FIG. 4B, the second driver 402 may include a first transistor T52, a second transistor T62, a first resistor R12, and a second resistor R22.

A power supply voltage VDD may be applied to one end of the first transistor T52, and the other end of the first transistor T52 may be electrically connected to the first resistor R12. One end of the second transistor T62 may be electrically connected to the second resistor R22, and a ground voltage VSS may be applied to the other end of the second transistor T62.

One end of the first resistor R12 may be electrically connected to the first transistor T52, and the other end of the first resistor R12 may be electrically connected to the first node N32. One end of the second resistor R22 may be electrically connected to the third node N32, and the other end of the second resistor R22 may be electrically connected to the second transistor T62.

A gate of the first transistor T52 and a gate of the second transistor T62 may receive the second input data I_data2. The first node N32 may output second PAM3 signals 2_PAM3. For example, the first transistor T52 and the second transistor T62 of the second driver 402 may control a rising edge or falling edge of the second PAM3 signals 2_PAM3.

The first transistor T52 may include a PMOS transistor, and the second transistor T62 may include a NMOS transistor. The first resistor R12 and the second resistor R22 may be voltage distribution resistors.

Figure 5A:
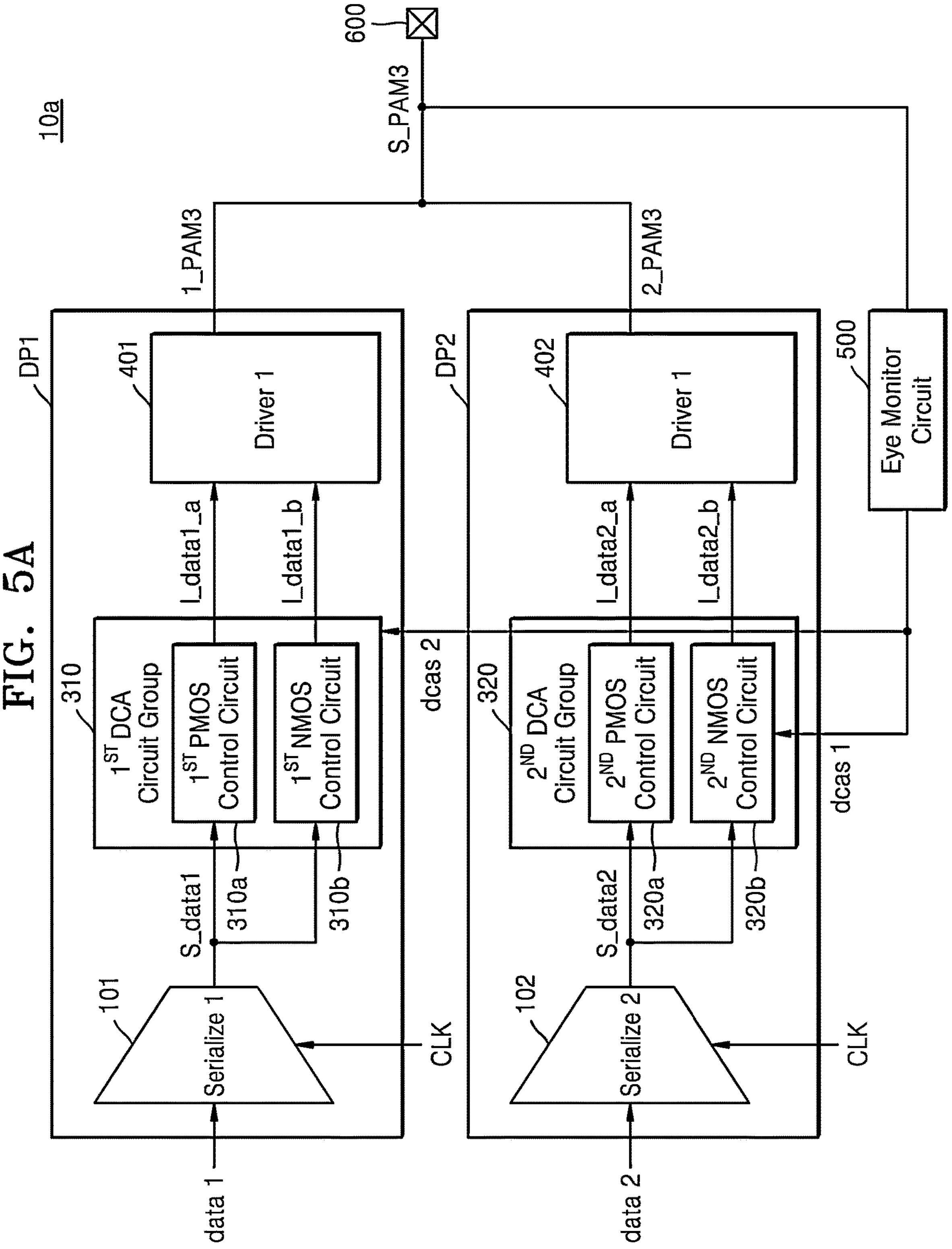
FIGS. 5A and 5B are block diagrams illustrating a PAM3 transmitter according to an embodiment.
Figure 5B:
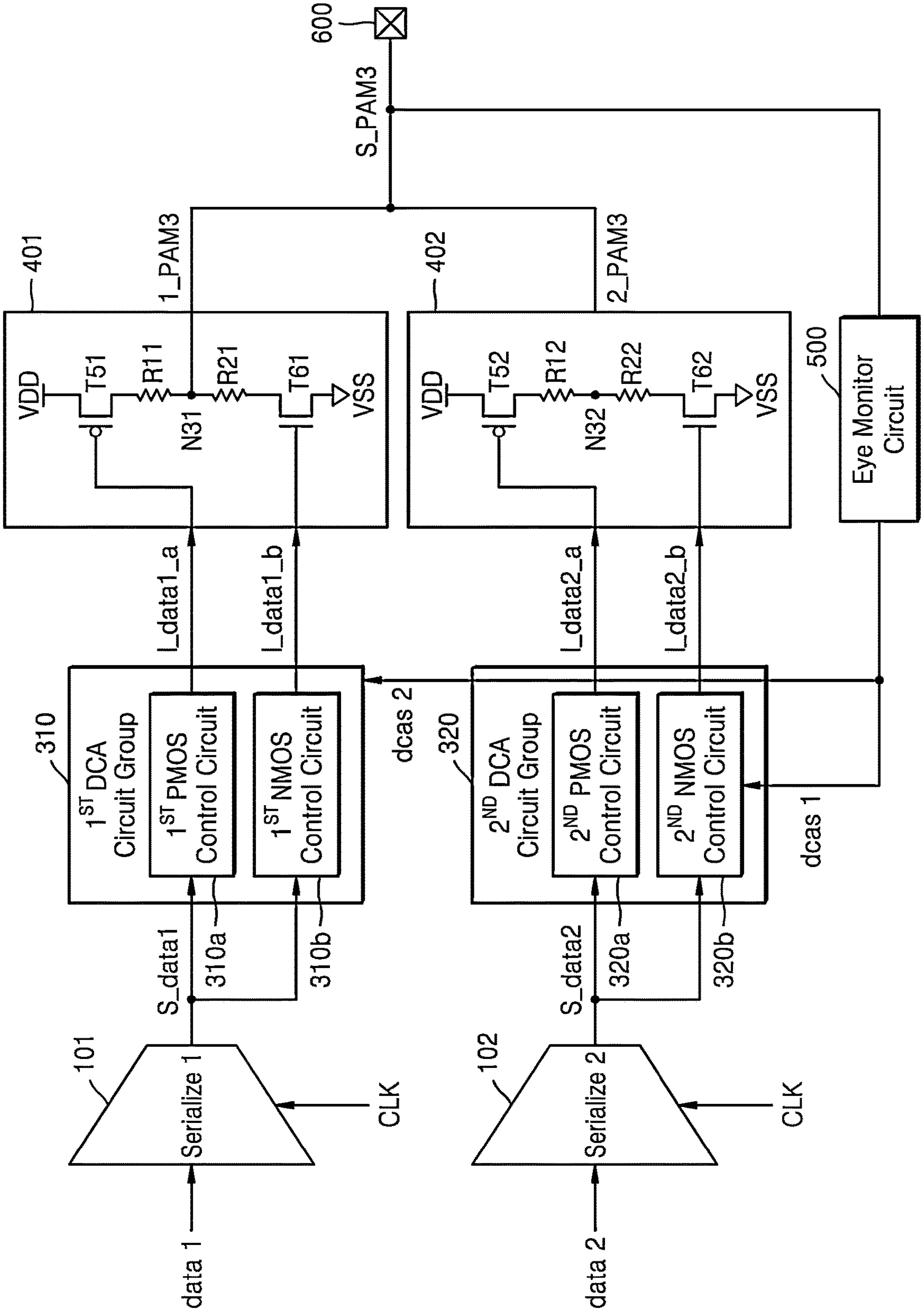

FIGS. 5A and 5B are block diagrams illustrating a PAM3 transmitter 10*a* according to an embodiment. FIG. 5A is a diagram schematically illustrating the PAM3 transmitter 10*a*, and FIG. 5B is a diagram illustrating the configuration of the PAM3 transmitter 10*a* of FIG. 5A in detail. Redundant descriptions with FIGS. 1A and 1B and FIGS. 4A and 4B will be omitted.

Referring to FIGS. 5A and 5B, the PAM3 transmitter 10*a* may include a first serializer 101, a second serializer 102, a first DCA circuit group 310, a second DCA circuit group 320, a first driver 401, a second driver 402, an eye monitor circuit 500, and an output pad 600.

The first DCA circuit group 310 may include a plurality of DCA circuits, and the second DCA circuit 302 may include a plurality of DCA circuits. For example, the first DCA circuit group 310 may include two DCA circuits (according to examples of FIGS. 5A and 5B, a first PMOS control circuit 310*a* and a first NMOS control circuit 310*b*), and the second DCA circuit group 320 may include two DCA circuits (according to the examples of FIGS. 5A and 5B, a second PMOS control circuit 320*a* and a second NMOS control circuit 320*b*). For example, a plurality of DCA circuits may be arranged in the first DCA circuit group 310 in parallel, and a plurality of DCA circuits may be arranged in the second DCA circuit group 320 in parallel. Each of the first PMOS control circuit 310*a*, the first NMOS control circuit 310*b*, the second PMOS control circuit 320*a*, and the second NMOS control circuit 320*b* may be implemented substantially the same as the DCA circuits 301 and 302 described with reference to FIGS. 3A and 3B.

The eye monitor circuit 500 may provide first DCA signals dcas1 to the first DCA circuit group 310 and may provide second DCA signals dcas2 to the second DCA circuit group 320.

The first DCA circuit 301 may receive the first serial data S_data1 and may output the first input data I_data1. The first input data I_data1 may include first PMOS input data I_data1_*a* and first NMOS input data I_data1_*b*. More specifically, the first PMOS control circuit 310*a* may receive the first serial data S_data1 and may output first PMOS input data I_data1_*a*. The first NMOS control circuit 310*b* may receive the first serial data S_data1 and may output the first NMOS input data I_data1_*b*. The first DCA circuit group 310 may adjust the duty cycle of the first input data I_data1 to output the adjusted duty cycle signal to the first driver 401. More specifically, the first PMOS control circuit 301*a* may adjust the duty cycle of the first PMOS input data I_data1_*a* to output the adjusted duty cycle signal to the first driver 401. The first NMOS control circuit 310*b* may adjust the duty cycle of the first NMOS input data I_data1_*b* to output the adjusted duty cycle signal to the first driver 401. The input data signals I_data1_*a* and I_data1_*b* with adjusted duty cycles, respectively, are generated by adjusting the duty cycle of the first serial data S_data1.

Referring to FIGS. 4A through 5B together, the first driver 401 may receive the first input data I_data1 through gate terminals of the first transistor T51 and the second transistor T61. More specifically, the first driver 401 may receive the first PMOS input data I_data1_*a* and allow the first PMOS input data I_data1_*a* to be applied to the gate terminal of the first transistor T51. Also, the first driver 401 may receive the first NMOS input data I_data1_*b* and allow the first NMOS input data I_data1_*b* to be applied to the gate terminal of the second transistor T61. The first driver 401 may output the first PAM3 signal 1_PAM3 through the first node N31. The second DCA circuit group 320 may receive the second serial data S_data2 and may output the second input data I_data2. The second input data I_data2 may include second PMOS input data I_data2_*a* and second NMOS input data I_data2_*b*. More specifically, the second PMOS control circuit 320*a* may receive the second serial data S_data2 and may output second PMOS input data I_data2_*a*. The second NMOS control circuit 320*b* may receive the second serial data S_data2 and may output the second NMOS input data I_data2_*b*. The second DCA circuit group 320 may adjust the duty cycle of the second input data I_data2 to output the adjusted duty cycle signal to the second driver 402. More specifically, the second PMOS control circuit 320*a* may adjust the duty cycle of the second PMOS input data I_data2_*a* to output the adjusted duty cycle signal to the second driver 402. The second NMOS control circuit 320*b* may adjust the duty cycle of the second NMOS input data I_data2_*b* to output the adjusted duty cycle signal to the second driver 402. The input data signals I_data2_*a* and I_data2_*b* with adjusted duty cycles, respectively, are generated by adjusting the duty cycle of the second serial data S_data2

Referring to FIGS. 4A through 5B together, the second driver 402 may receive the second input data I_data2 through gate terminals of the first transistor T52 and the second transistor T62. More specifically, the second driver 402 may receive the second PMOS input data I_data2_*a* and allow the second PMOS input data I_data2_*a* to be applied to the gate terminal of the first transistor T52. Also, the second driver 402 may receive the second NMOS input data I_data2_*b* and allow the second NMOS input data I_data2_*b* to be applied to the gate terminal of the second transistor T62. The second driver 402 may output second PAM3 signals 2_PAM3 through the first node N32.

As a result of adjusting the duty cycle of the first input data I_data1 and the duty cycle of the second input data I_data2 provided to the first driver 402 and the second driver 402, respectively, by using each of the first DCA circuit group 310 and the second DCA circuit group 320, the size of the upper eye patterns and the size of the lower eye patterns of the PAM3 signals S_PAM3 may be equal or approximately equal to each other.

Figure 6A:
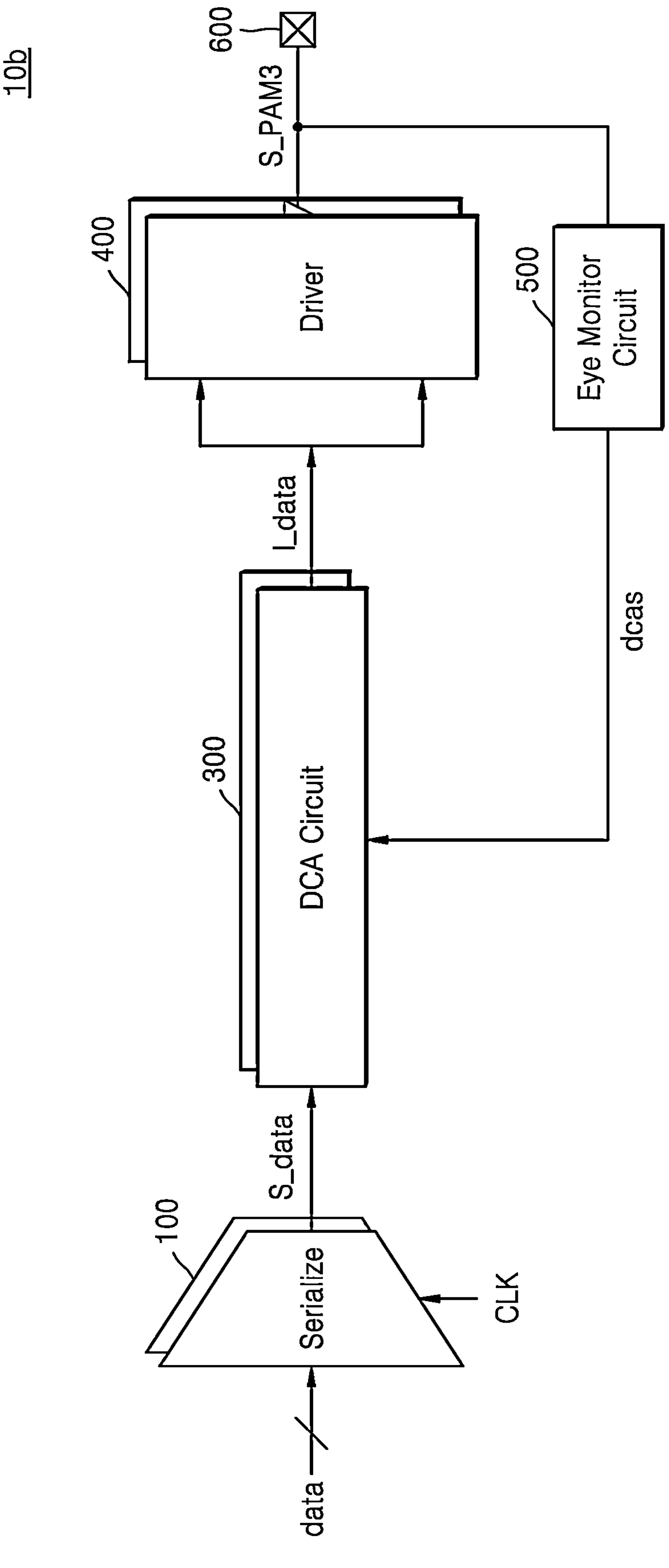
FIGS. 6A and 6B are block diagrams illustrating a PAM3 transmitter according to an embodiment.
Figure 6B:
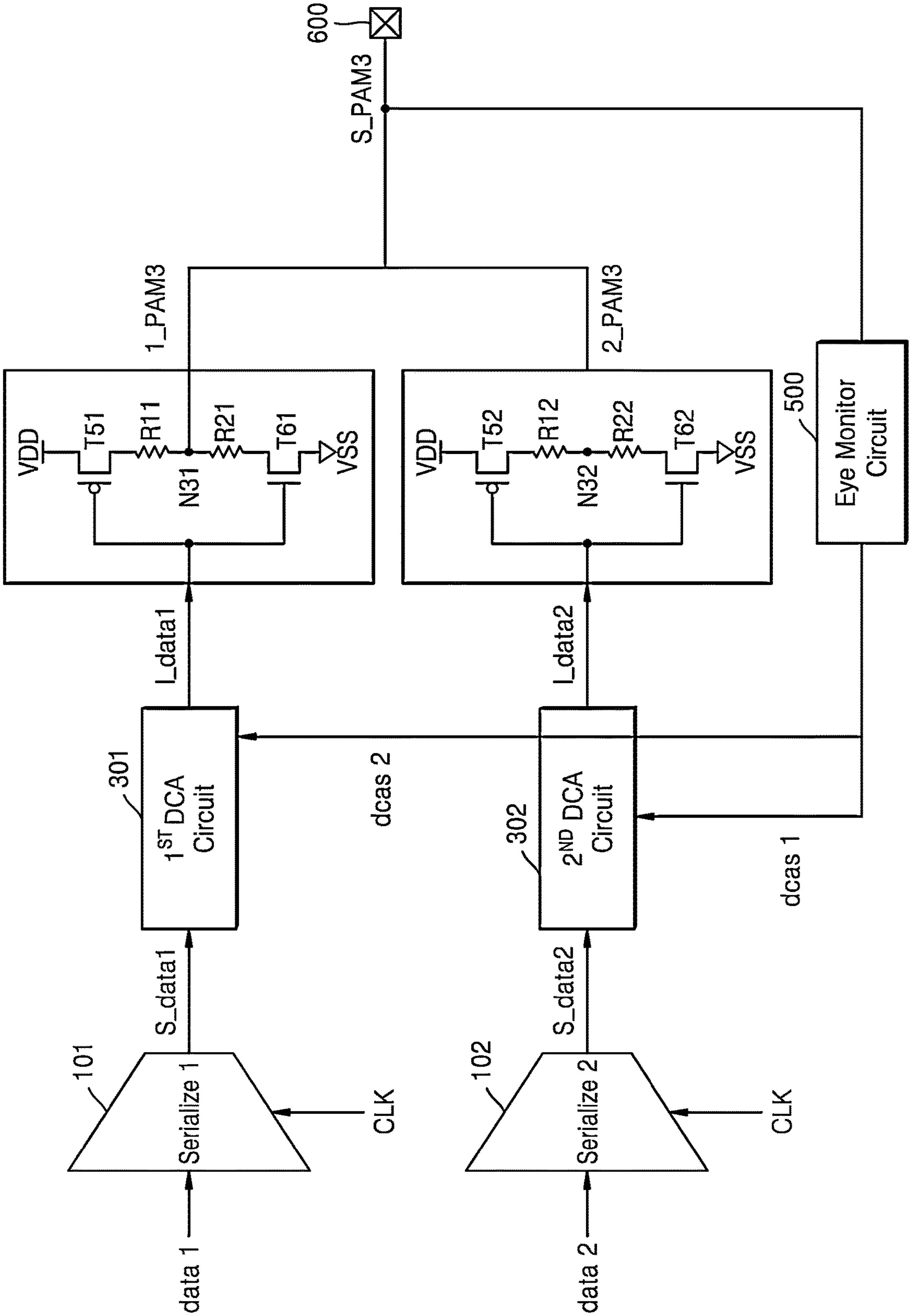

FIGS. 6A and 6B are block diagrams illustrating a PAM3 transmitter 10*b* according to an embodiment. FIG. 6A is a diagram schematically illustrating the PAM3 transmitter 10*b*, and FIG. 5B is a diagram illustrating the configuration of the PAM3 transmitter 10*b* of FIG. 6A in detail. Redundant descriptions with FIGS. 1A and 1B, FIGS. 4A and 4B and FIGS. 5A and 5B will be omitted.

Referring to FIG. 6A, the PAM3 transmitter 10*b* may include a serializer 100, a DCA circuit 300, a driver 400, an eye monitor circuit 500, and an output pad 600.

A difference between FIGS. 5A and 5B is that the DCA circuit 300 commonly adjusts the duty cycle of the input data I_data and provides the adjusted duty cycle signal to the driver 400 so that PAM3 signals in which upper eye patterns and lower eye patterns of the PAM3 signals S_PAM3 may be output.

Referring to FIG. 6B, the PAM3 transmitter 10*b* may include a first serializer 101, a second serializer 102, a first DCA circuit group 301, a second DCA circuit group 302, a first driver 401, a second driver 402, an eye monitor circuit 500, and an output pad 600. Unlike in FIGS. 5A and 5B, one input data I_data may be input to one driver (i.e., the first driver 401 or the second driver 402). More specifically, the same signal, i.e., the first input data I_data1 output from the first DCA circuit 301 may be input to the first transistor T51 and the second transistor T61 of the first driver 401. Also, the same signal, i.e., the first input data I_data1 output from the second DCA circuit 302 may be input to the first transistor T52 and the second transistor T62 of the second driver 402.

The eye monitor circuit 500 may provide the first DCA signals dcas1 to the first DCA circuit group 301 and may provide the second DCA signals dcas2 to the second DCA circuit group 302.

As a result of adjusting the duty cycle of the first input data I_data1 and the duty cycle of the second input data I_data2 provided to the first driver 402 and the second driver 402, respectively, by using each of the first DCA circuit group 301 and the second DCA circuit group 302, the size of the upper eye patterns and the size of the lower eye patterns of the PAM3 signals S_PAM3 may be equal to or approximately equal to each other.

Figure 7:
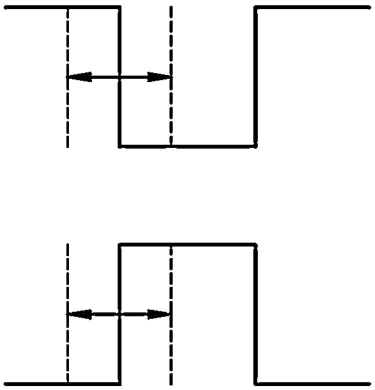
FIG. 7 is a diagram that illustrates an operating method of a DCA circuit according to an embodiment.

FIG. 7 is a diagram for describing an operating method of a DCA circuit 300 according to an embodiment.

Referring to FIG. 7, a method of adjusting the duty cycle of the first input data I_data1 and the duty cycle of the second input data I_data2 by using the first DCA circuit 301 and the second DCA circuit 302 is shown.

Referring to FIGS. 3A and 7 together, by increasing the driving force of the first transistor T11, the rising edge of the first input data I_data1 may be moved to the left on the time axis. The duty cycle of the first input data I_data1 may be increased. Conversely, by decreasing the driving force of the first transistor T11, the rising edge of the first input data I_data1 may be moved to the right on the time axis. The duty cycle of the first input data I_data1 may be decreased.

By increasing the driving force of the second transistor T21, the falling edge of the first input data I_data1 may be moved to the left on the time axis. The duty cycle of the first input data I_data1 may be decreased. Conversely, by decreasing the driving force of the second transistor T21, the rising edge of the first input data I_data1 may be moved to the right on the time axis. The duty cycle of the first input data I_data1 may be increased.

To increase or decrease the driving force of the transistor (the first transistor T11 or the second transistor T12), the magnitude of a voltage applied to a gate of the transistor may be changed. By increasing the magnitude of a voltage applied to the gate of the transistor (i.e., the magnitude of the pull-up enable signal ENPU or the pull-down enable signal ENPD), the driving force may be increased, and by decreasing the magnitude of a voltage applied to the gate of the transistor (i.e., the magnitude of the pull-up enable signal ENPU or the pull-down enable signal ENPD), the driving force may be decreased.

In other embodiments, each of the first transistor T11 and the second transistor T12 may include a plurality of unit transistors connected in parallel with each other. The driving force of each of the first transistor T11 and the second transistor T12 may be substantially proportional to the number of turn-on states of the unit transistors included in each of the first transistor T11 and the second transistor T12. In this case, the pull-up enable signals ENPU may be codes for determining the number of unit transistors to be turned on, included in the first transistor T11, and the pull-down enable signals ENPD may be codes for determining the number of unit transistors to be turned on, included in the second transistor T12.

Referring to FIGS. 3B and 7 together, by increasing the voltage level of the pull-up enable signals ENPU to be input to the first transistor T12, the rising edge of the second input data I_data2 may be moved to the left on the time axis. The duty cycle of the second input data I_data2 may be increased. Conversely, by decreasing the voltage level of the pull-up enable signals ENPU) input to the second transistor T22, the rising edge of the second input data I_data2 may be moved to the right on the time axis. The duty cycle of the second input data I_data2 may be decreased.

By increasing the voltage level of the pull-up enable signals ENPU input to the second transistor T22, the falling edge of the second input data I_data2 may be moved to the left on the time axis. The duty cycle of the second input data I_data2 may be decreased. Conversely, by increasing the voltage level of the pull-down enable signals ENPD input to the second transistor T22, the rising edge of the second input data I_data2 may be moved to the right on the time axis. The duty cycle of the second input data I_data2 may be increased.

To increase or decrease the driving force of the transistor (the first transistor T11 or the second transistor T12), the magnitude of a voltage applied to a gate of the transistor may be changed. By increasing the magnitude of a voltage applied to the gate of the transistor (i.e., the magnitude of the pull-up enable signal ENPU or the pull-down enable signal ENPD), the driving force may be increased, and by decreasing the magnitude of a voltage applied to the gate of the transistor (i.e., the magnitude of the pull-up enable signal ENPU or the pull-down enable signal ENPD), the driving force may be decreased.

In other embodiments, each of the first transistor T11 and the second transistor T12 may include a plurality of unit transistors. The driving force of each of the first transistor T11 and the second transistor T12 may be substantially proportional to the number of turn-on states of the unit transistors included in each of the first transistor T11 and the second transistor T12. In this case, the pull-up enable signals ENPU may be codes for determining the number of unit transistors to be turned on, included in the first transistor T11, and the pull-down enable signals ENPD may be codes for determining the number of unit transistors to be turned on, included in the second transistor T12.

Figure 8:
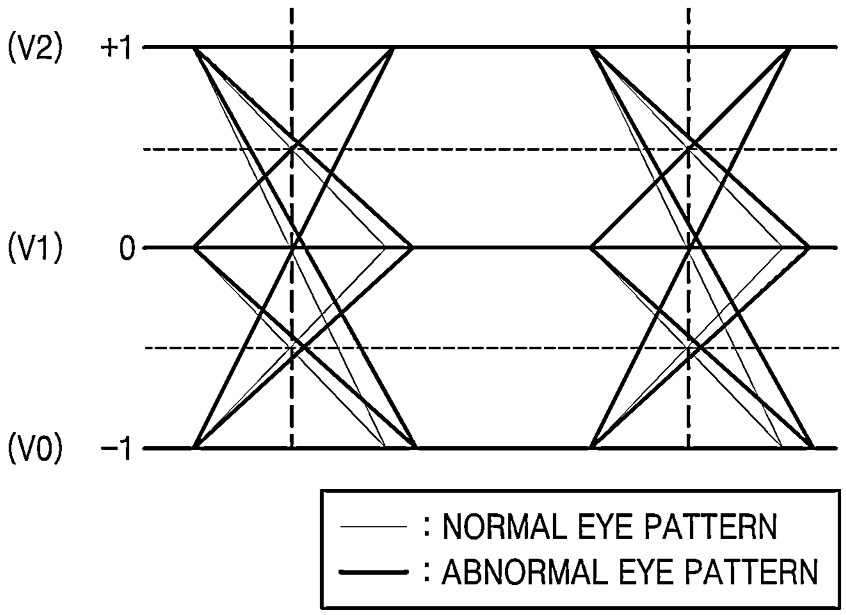
FIGS. 8 and 9 are diagrams illustrating eye patterns of an eye monitor circuit according to an embodiment.
Figure 9:
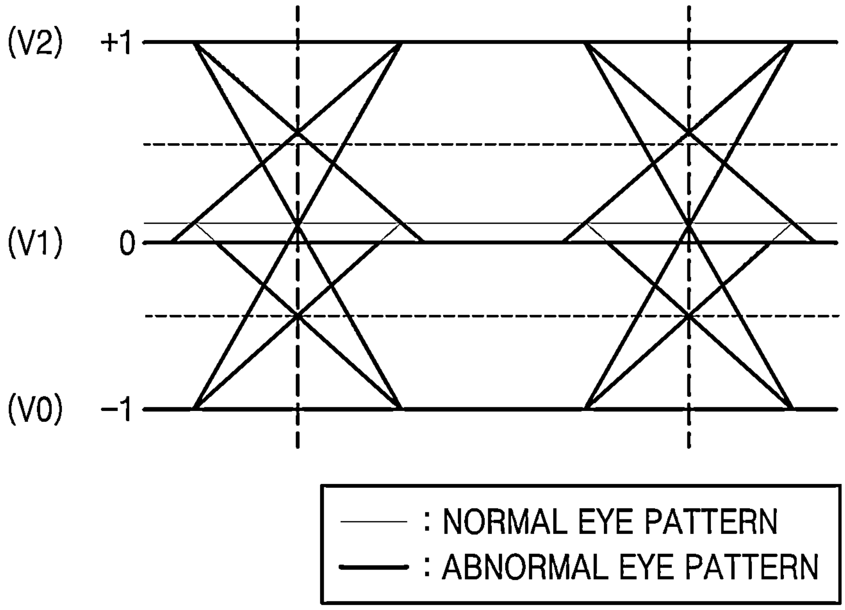
Figure 10:
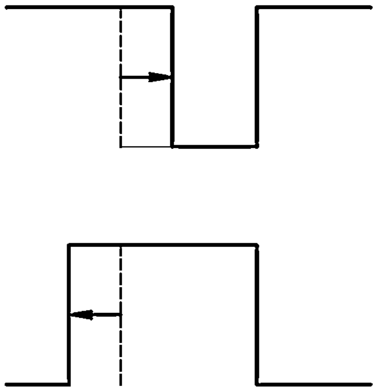
FIG. 10 is a diagram that illustrates an operating method of a DCA circuit according to an embodiment.

FIGS. 8 and 9 are diagrams illustrating eye patterns of an eye monitor circuit 500 according to an embodiment. FIG. 10 is a diagram illustrating an operating method of a DCA circuit 300 according to an embodiment.

Referring to FIG. 8, the PAM3 signals S_PAM3 may represent the case where a rising time tr is greater than a falling time rf so that deterioration of lower eye patterns is more severe than deterioration of upper eye patterns. Referring to FIG. 9, when a second voltage level V1 of the PAM3 signals S_PAM3 is close to a first voltage level V0 (or when the second voltage level V1 falls), the size of the upper eye patterns may be greater than the size of the lower eye patterns. The case where the size of the upper eye patterns and the size of the lower eye patterns are not the same and the size of one of the upper eye patterns and the lower eye patterns is greater than the other one, may be referred to as asymmetric eye patterns.

A method of enhancing asymmetric eye patterns when deterioration of the lower eye patterns is more severe than deterioration of the upper eye patterns or the size of the lower eye patterns is smaller than the size of the upper eye patterns, described with reference to FIGS. 8 and 9, will be described below with reference to FIG. 10.

Referring to FIGS. 3A, 5, 6 and 10 together, the eye monitor circuit 500 may receive the PAM3 signals S_PAM3 and may monitor eye patterns of the received PAM3 signals S_PAM3. The eye monitor circuit 500 may output the first DCA signals dcas1 to the first DCA circuit 301 to enhance the asymmetric eye patterns, as shown in FIGS. 8 and 9. The first DCA circuit 301 may adjust the duty cycle of the first input data I_data1 in response to the first DCA signals dcas1.

In an embodiment, the first transistor T11 of the first DCA circuit 301 may adjust the duty cycle of the first input data I_data1 based on the pull-up enable signals ENPU. Based on the description with reference to FIG. 7, by increasing the driving force of the first transistor T11, the duty cycle of the first input data I_data1 may be increased. That is, the duty cycle of the first input data I_data1 output from the first DCA circuit 301 may be increased.

In an embodiment, the second transistor T21 of the first DCA circuit 301 may adjust the duty cycle of the first input data I_data1 based on the pull-down enable signals ENPD. Based on the description with reference to FIG. 7, by decreasing the driving force of the second transistor T21, the duty cycle of the first input data I_data1 may be increased. That is, the duty cycle of the first input data I_data1 output from the first DCA circuit 301 may be increased. A gate terminal of the first transistor T51 and a gate terminal of the second transistor T61 of the first driver 400 may receive the first input data I_data1 of which the duty cycle is increased. The first transistor T51 may adjust the rising edge of the first PAM3 signals 1_PAM3 slowly, and the second transistor T61 may adjust the falling edge of the first PAM3 signals 1_PAM3. Here, the slow adjustment of the rising edge may mean moving the rising edge to the right on the time axis, as shown in FIG. 10, and the fast adjustment of the falling edge may mean moving the falling edge to the left on the time axis, as shown in FIG. 10.

By using the first transistor T51 and the second transistor T61 of the first driver 400, the first input data I_data1 may be received, and the rising edge of the first PAM3 signals 1_PAM3 may be slowly adjusted, and the falling edge of the first PAM3 signals 1_PAM3 may be quickly adjusted so that the first PAM3 signals 1_PAM3 may be output in a balanced way.

A method of increasing the duty cycle of the first input data I_data1 described above may be substantially equally applied to the second DCA circuit 302. That is, when the PAM3 signals S_PAM3 have asymmetric eye patterns in which deterioration of the lower eye patterns is more severe than deterioration of the upper eye patterns or the size of the lower eye patterns is smaller than the size of the upper eye patterns, the duty cycle of the second input data I_data2 output from the second DCA circuit 302 may also be increased based on the second DCA signals dcas2. Thus, the second PAM3 signals 2_PAM3 may also be output in a balanced way.

Referring to FIGS. 3B, 5, and 10 together, the eye monitor circuit 500 may receive the PAM3 signals S_PAM3 and may monitor eye patterns of the received PAM3 signals S_PAM3. As shown in FIGS. 8 and 9, the eye monitor circuit 500 may output the second DCA signals dcas2 to the second DCA circuit group 320 to enhance the asymmetric eye patterns when deterioration of the lower eye patterns is more severe than deterioration of the upper eye patterns or the size of the lower eye patterns is smaller than the size of the upper eye patterns. The second CA circuit 320 may adjust the duty cycle of the second input data I_data2 in response to the second DCA signals dcas2. More specifically, the duty cycle of the second PMOS input data I_data2_*a* and/or the second NMOS input data I_data_b may be adjusted.

The second DCA circuit group 320 may include a second PMOS control circuit 320*a* and a second NMOS control circuit 320*b*. Each of the second PMOS control circuit 320*a* and the second NMOS control circuit 320*b* may have substantially the same configuration as that of the second DCA circuit 302 shown in FIG. 3B. In an embodiment, the first transistor T12 of the second PMOS control circuit 320*a* may adjust the duty cycle of the second PMOS input data I_data2_*a* output from the second PMOS control circuit 320*a* based on the pull-up enable signals ENPU. More specifically, the duty cycle of the second PMOS input data I_data2_*a* may be increased by increasing the driving force of the first transistor T12. That is, the duty cycle of the second PMOS input data I_data2_*a* output from the second PMOS control circuit 320*a* may be increased.

In an embodiment, the second transistor T22 of the second PMOS control circuit 320*a* may adjust the duty cycle of the second PMOS input data I_data2_*a* based on the pull-down enable signals ENPD. More specifically, the duty cycle of the second PMOS input data I_data2_*a* may be increased by decreasing the driving force of the second transistor T22. That is, the duty cycle of the second PMOS input data I_data2_*a* output from the second PMOS control circuit 320*a* may be increased.

To increase the duty cycle of the second PMOS input data I_data2_*a* described above, increasing of the driving force of the first transistor T12 and decreasing of the driving force of the second transistor T22 in the second PMOS circuit 320*a* may be optionally or simultaneously performed in accordance with different embodiments.

In an embodiment, the first transistor T12 of the second NMOS control circuit 320*b* may adjust the duty cycle of the second PMOS input data I_data2_*a* output from the second NMOS control circuit 320*b* based on the pull-up enable signals ENPU. More specifically, the duty cycle of the second NMOS input data I_data2_*b* may be increased by increasing the driving force of the first transistor T12. That is, the duty cycle of the second NMOS input data I_data2_*b* output from the second NMOS control circuit 320*b* may be increased.

In an embodiment, the second transistor T22 of the second NMOS control circuit 320*b* may adjust the duty cycle of the second NMOS input data I_data2_*b* based on the pull-down enable signals ENPD. More specifically, the duty cycle of the second NMOS input data I_data2_*b* may be increased by decreasing the driving force of the second transistor T22. That is, the duty cycle of the second NMOS input data I_data2_*b* output from the second NMOS control circuit 320*b* may be increased.

To increase the duty cycle of the second NMOS input data I_data2_*b* described above, increasing of the driving force of the first transistor T12 and decreasing of the driving force of the second transistor T22 in the second NMOS circuit 320*b* may be optionally or simultaneously performed in accordance with different embodiments.

A gate terminal of the first transistor T52 and a gate terminal of the second transistor T62 of the second driver 400 may receive the second input data I_data2 of which the duty cycle is increased. More specifically, the first transistor T52 may adjust the rising edge of the second PAM3 signals 2_PAM3 slowly based on the second PMOS input data I_data2_*a* of which the duty cycle is increased, and the second transistor T62 may adjust the falling edge of the second PAM3 signals 2_PAM3 quickly based on the second NMOS input data I_data2_*b* of which the duty cycle is increased. By using the first transistor T52 and the second transistor T62 of the second driver 400, the second input data I_data2 may be received, and the rising edge of the second PAM3 signals 2_PAM3 may be slowly adjusted, and the falling edge of the second PAM3 signals 2_PAM3 may be quickly adjusted so that the second PAM3 signals 1_PAM3 may be output in a balanced way.

A method of increasing the duty cycle of the above-described second input data I_data2, i.e., the second PMOS input data I_data2_*a* and the second NMOS input data I_data2_*b* may also be substantially applied to the first DCA circuit group 310. That is, when the PAM3 signals S_PAM3 have asymmetric eye patterns in which deterioration of lower eye patterns is more severe than deterioration of upper eye patterns or the size of the lower eye patterns is smaller than the size of the upper eye patterns, the duty cycle of the first input data I_data1 output from the first DCA circuit 310 may also be increased based on the second DCA signals dcas2. Thus, the second PAM3 signals 2_PAM3 may also be output in a balanced way.

Thus, the first PAM3 signals 1_PAM3 and the second PAM3 signals 2_PAM3 may be output in a balanced way, so that deterioration of eye patterns of the PAM3 signals S_PAM3 may be decreased and the size of the upper eye pattern and the size of the lower eye patterns may be the same.

Figure 11:
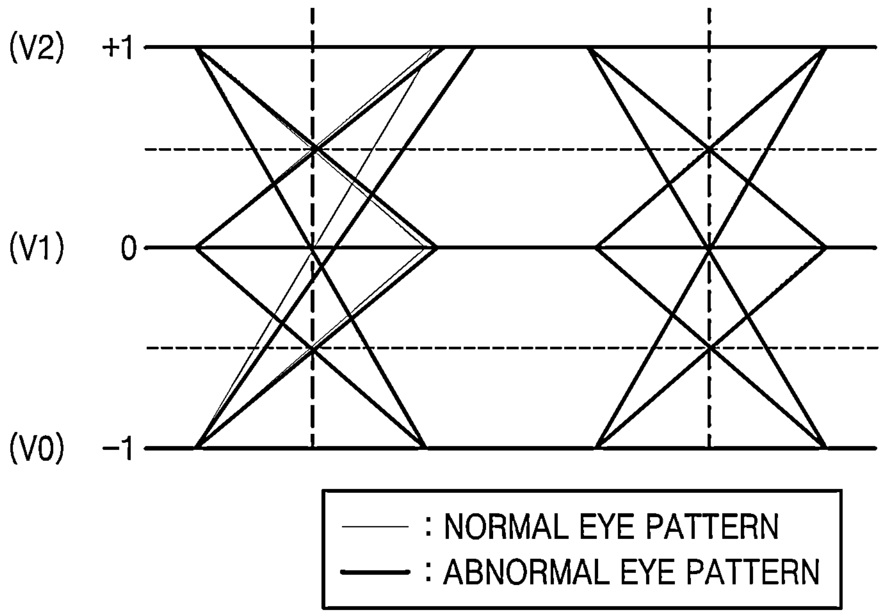
FIGS. 11 and 12 are diagrams illustrating eye patterns of an eye monitor circuit according to an embodiment.
Figure 12:
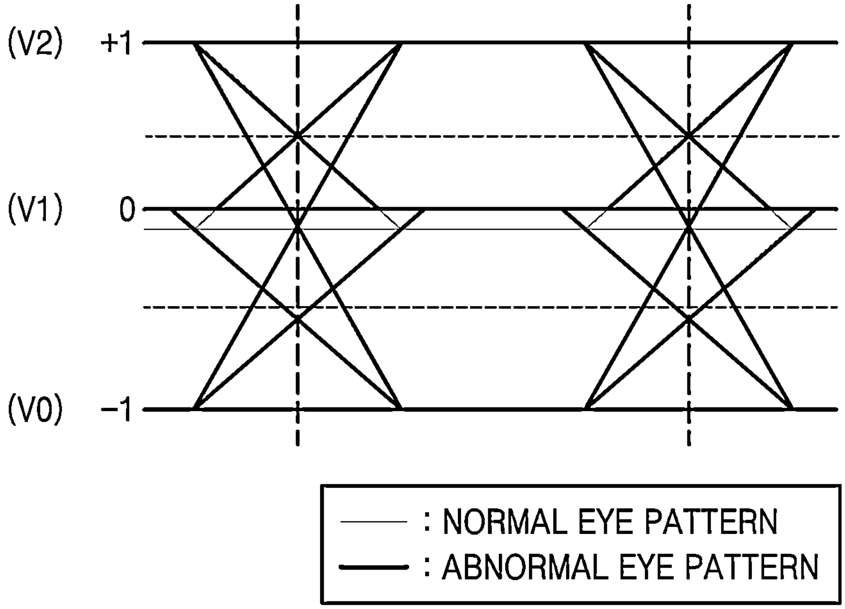
Figure 13:
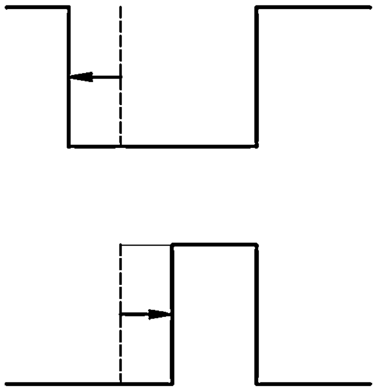
FIG. 13 is a diagram that illustrates an operating method of a DCA circuit according to an embodiment.

FIGS. 11 and 12 are diagrams illustrating eye patterns for illustrating an operating method of a PAM 3 transmitter according to an embodiment. FIG. 13 is a diagram for illustrating an operating method of a DCA circuit according to an embodiment.

Referring to FIG. 11, the PAM3 signals S_PAM3 may represent the case where a rising time tr is greater than a falling time rf so that deterioration of upper eye patterns is more severe than deterioration of lower eye patterns. Referring to FIG. 12, when the second voltage level V1 of the PAM3 signals S_PAM3 is close to a third voltage level V2 (or when the second voltage level V1 falls), the size of the upper eye patterns may be greater than the size of the lower eye patterns. Here, the case where pattern deterioration of the PAM3 signals S_PAM3 is severe, may mean a ratio of level mismatch (RLM).

A method of enhancing asymmetric eye patterns when deterioration of the upper eye patterns is more severe than deterioration of the lower eye patterns or the size of the upper eye patterns is smaller than the size of the lower eye patterns, described with reference to FIGS. 11 and 12, is described below with reference to FIG. 13.

Referring to FIGS. 3A, 5, 6 and 13 together, the eye monitor circuit 500 may receive the PAM3 signals S_PAM3 and may monitor eye patterns of the received PAM3 signals S_PAM3. The eye monitor circuit 500 may output the first DCA signals dcas1 to the first DCA circuit 301 to enhance the asymmetric eye patterns, as shown in FIGS. 11 and 12. The first DCA circuit 301 may adjust the duty cycle of the first input data I_data1 in response to the first DCA signals dcas1.

In an embodiment, the second transistor T21 of the first DCA circuit 301 may adjust the duty cycle of the first input data I_data1 based on the pull-down enable signals ENPD. By increasing the driving force of the first transistor T21 based on the description with reference to FIG. 7, the duty cycle of the first input data I_data1 may be decreased. That is, the duty cycle of the first input data I_data1 output from the first DCA circuit 301 may be decreased.

In an embodiment, the first transistor T11 of the first DCA circuit 301 may adjust the duty cycle of the first input data I_data1 based on the pull-up enable signals ENPU. By increasing the driving force of the first transistor T11 based on the description with reference to FIG. 7, the duty cycle of the first input data I_data1 may be decreased. That is, the duty cycle of the first input data I_data1 output from the first DCA circuit 301 may be decreased.

A gate terminal of the first transistor T11 and a gate terminal of the second transistor T21 of the first driver 400 may receive the first input data I_data1 of which the duty cycle is decreased. The first transistor T11 may adjust the rising edge of the first PAM3 signals 1_PAM3 quickly, and the second transistor T21 may adjust the falling edge of the first PAM3 signals 1_PAM3 slowly. Here, the fast adjustment of the rising edge may mean moving of the rising edge to the left on the time axis, as shown in FIG. 13, and the slow adjustment of the falling edge may mean moving of the falling edge to the right on the time axis, as shown in FIG. 13.

By using the first transistor T11 and the second transistor T21 of the first driver 400, the first input data I_data1 may be received, and the rising edge of the first PAM3 signals 1_PAM3 may be quickly adjusted, and the falling edge of the first PAM3 signals 1_PAM3 may be slowly adjusted so that the first PAM3 signals 1_PAM3 may be output in a balanced way.

A method of decreasing the duty cycle of the first input data I_data1 described above may be substantially applied to the second DCA circuit 302. That is, when the PAM3 signals S_PAM3 have asymmetric eye patterns in which deterioration of the upper eye patterns is more severe than deterioration of the lower eye pattern and the size of the upper eye patterns is smaller than the size of the lower eye patterns, the duty cycle of the second input data I_data2 output from the second DCA circuit 302 may also be decreased based on the second DCA signals dcas2. Thus, the second PAM3 signals 2_PAM3 may also be output in a balanced way.

Referring to FIGS. 3B, 5, and 13 together, the eye monitor circuit 500 may receive the PAM3 signals S_PAM3 and may monitor eye patterns of the received PAM3 signals S_PAM3. As shown in FIGS. 11 and 12, the eye monitor circuit 500 may output the second DCA signals dcas2 to the second DCA circuit group 320 to enhance the asymmetric eye patterns when deterioration of the upper eye patterns is more severe than deterioration of the lower eye patterns and the size of the upper eye patterns is smaller than the size of the lower eye patterns. The second CA circuit 320 may adjust the duty cycle of the second input data I_data2 in response to the second DCA signals dcas2. More specifically, the duty cycle of the second PMOS input data I_data2_*a* and/or the second NMOS input data I_data_b may be adjusted.

The second DCA circuit group 320 may include a second PMOS control circuit 320*a* and a second NMOS control circuit 320*b*. Each of the second PMOS control circuit 320*a* and the second NMOS control circuit 320*b* may have substantially the same configuration as that of the second DCA circuit 302 shown in FIG. 3B. In an embodiment, the second transistor T22 of the second NMOS control circuit 320*b* may adjust the duty cycle of the second NMOS input data I_data2_*b* output from the second NMOS control circuit 320*b* based on the pull-down enable signals ENPD. More specifically, the duty cycle of the second NMOS input data I_data2_*b* may be decreased by increasing the driving force of the second transistor T22. That is, the duty cycle of the second NMOS input data I_data2_*b* output from the second NMOS control circuit 320*b* may be decreased.

In an embodiment, the first transistor T12 of the second NMOS control circuit 320*b* may adjust the duty cycle of the second NMOS input data I_data2_*b* based on the pull-up enable signals ENPU. More specifically, the duty cycle of the second NMOS input data I_data2_*b* may be decreased by decreasing the driving force of the first transistor T12. That is, the duty cycle of the second NMOS input data I_data2_*b* output from the second NMOS control circuit 320*b* may be decreased.

To increase the duty cycle of the second NMOS input data I_data2_*b* described above, increasing of the driving force of the second transistor T22 and decreasing of the driving force of the first transistor T12 in the second NMOS circuit 320*b* may be optionally or simultaneously performed in accordance with different embodiments.

In an embodiment, the second transistor T22 of the second PMOS control circuit 320*a* may adjust the duty cycle of the second PMOS input data I_data2_*a* output from the second PMOS control circuit 320*a* based on the pull-down enable signals ENPD. More specifically, the duty cycle of the second PMOS input data I_data2_*b* may be decreased by increasing the driving force of the second transistor T22. That is, the duty cycle of the second PMOS input data I_data2_*a* output from the second PMOS control circuit 320*a* may be decreased.

In an embodiment, the first transistor T12 of the second PMOS control circuit 320*a* may adjust the duty cycle of the second PMOS input data I_data2_*a* based on the pull-up enable signals ENPU. More specifically, the duty cycle of the second PMOS input data I_data2_*a* may be decreased by decreasing the driving force of the first transistor T12. That is, the duty cycle of the second PMOS input data I_data2_*a* output from the second PMOS control circuit 320*a* may be decreased.

To increase the duty cycle of the second PMOS input data I_data2_*a* described above, increasing of the driving force of the second transistor T22 and decreasing of the driving force of the first transistor T12 in the second PMOS circuit 320*a* may be optionally or simultaneously performed in accordance with different embodiments.

A gate terminal of the first transistor T52 and a gate terminal of the second transistor T62 of the second driver 400 may receive the second input data I_data2 of which the duty cycle is decreased. More specifically, the first transistor T52 may adjust the rising edge of the second PAM3 signals 2_PAM3 quickly based on the second PMOS input data I_data2_*a* of which the duty cycle is decreased, and the second transistor T62 may adjust the falling edge of the second PAM3 signals 2_PAM3 slowly based on the second NMOS input data I_data2_*b* of which the duty cycle is decreased. By using the first transistor T12 and the second transistor T22 of the second driver 400, the second input data I_data2 may be received, and the rising edge of the second PAM3 signals 2_PAM3 may be quickly adjusted, and the falling edge of the second PAM3 signals 2_PAM3 may be slowly adjusted so that the second PAM3 signals 1_PAM3 may be output in a balanced way.

A method of decreasing the duty cycle of the above-described second input data I_data2, i.e., the second PMOS input data I_data2_*a* and the second NMOS input data I_data2_*b* may also be substantially applied to the first DCA circuit group 310. That is, when the PAM3 signals S_PAM3 have asymmetric eye patterns in which deterioration of the upper eye patterns is more severe than deterioration of the lower eye patterns and the size of the upper eye patterns is smaller than the size of the lower eye patterns, the duty cycle of the first input data I_data1 output from the first DCA circuit 310 may also be decreased based on the first DCA signals dcas1. Thus, the second PAM3 signals 2_PAM3 may also be output in a balanced way.

Thus, the first PAM3 signals 1_PAM3 and the second PAM3 signals 2_PAM3 may be output in a balanced way, so that deterioration of eye patterns of the PAM3 signals S_PAM3 may be decreased and the size of the upper eye pattern and the size of the lower eye patterns may be the same or substantially the same.

Figure 14:
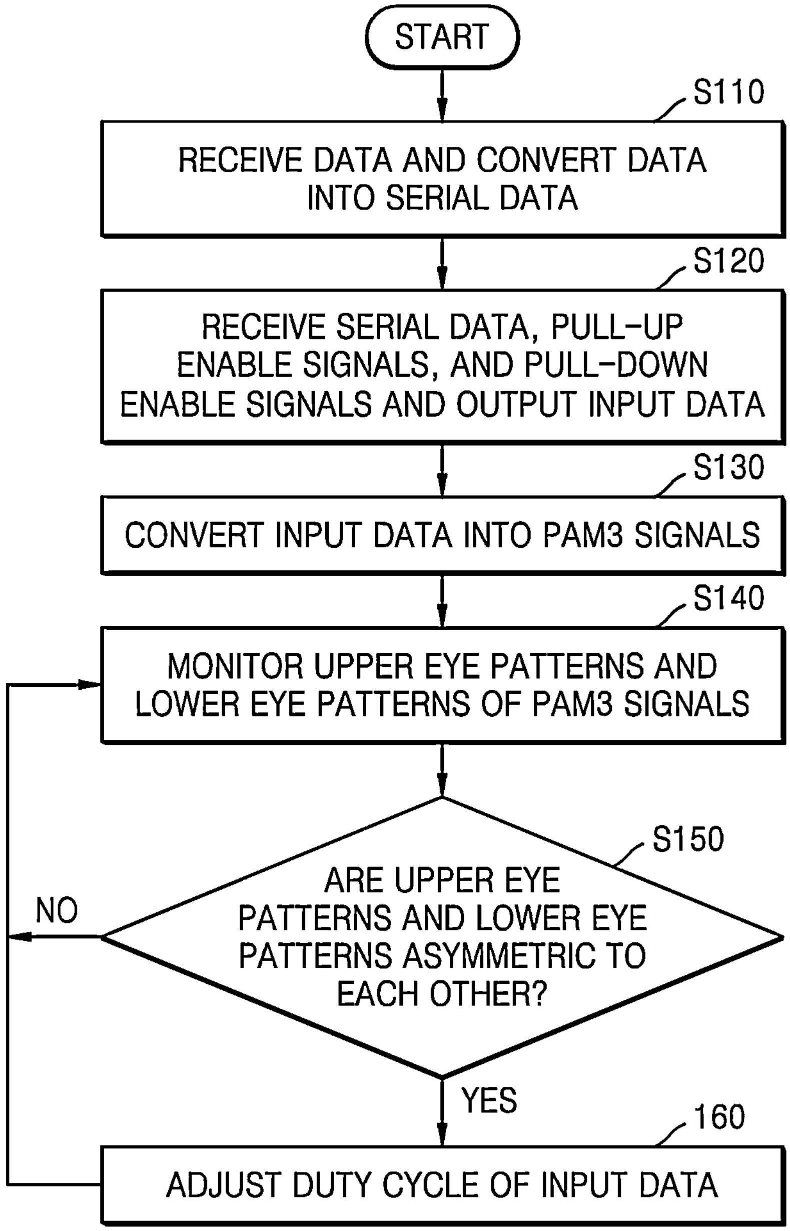
FIG. 14 is a flowchart illustrating an operating method of a PAM3 transmitter according to an embodiment.

FIG. 14 is a flowchart illustrating an operating method of the PAM3 transmitter 10 according to an embodiment.

Referring to FIG. 14, the PAM3 transmitter 10 may receive data and convert the data into serial data (S110). For example, referring to FIG. 1, the serializer 100 may convert the data into serial data S_data having a continuous data column format.

The DCA circuit 300 may receive the serial data S_data and receive pull-up enable signals and pull-down enable signals. For example, referring to FIG. 1A, the DCA circuit 300 may receive the serial data S_data and receive pull-up enable signals (ENPU of FIG. 3) and pull-down enable signals (ENPD of FIG. 3). The DCA circuit 300 may output input data I_data.

The driver 400 may convert the input data I_data into PAM3 signals (S130). For example, referring to FIG. 1A, the driver 400 may convert the input data I_data into PAM3 signals S_PAM3.

The eye monitor circuit 500 may monitor upper eye patterns and lower eye patterns of the PAM3 signals S_PAM3. For example, referring to FIG. 1, the eye monitor circuit 500 may monitor first eye patterns and second eye patterns of the PAM3 signals S_PAM3. The eye monitor circuit 500 may compare the size of the upper eye patterns with the size of the lower eye patterns of the PAM3 signals S_PAM3.

The eye monitor circuit 500 may compare whether the size of the upper eye patterns and the size of the lower eye patterns are asymmetric to each other (S150). When the size of the upper eye patterns and the size of the lower eye patterns are symmetrical to each other (NO of $150), operation S140 may be performed again.

Conversely, when the size of the upper eye patterns and the size of the lower eye patterns are asymmetric to each other (YES of S150), the DCA circuit 300 may adjust the duty cycle (S160). For example, referring to FIG. 1A, based on the DCA signals dcas generated by the eye monitor circuit 500, the DCA circuit 300 may adjust the duty cycle of the input data I_data to provide the adjusted duty type to the driver 400, so that the driver 400 may receive the input data I_data of which the duty cycle is adjusted, and may output the PAM3 signals S_PAM3. That is, the driver 400 may output PAM3 signals in which the upper eye patterns and the lower eye patterns of the PAM3 signals S_PAM3 are enhanced. After operation S160 is completed, the method may go back to operation S140 so that monitoring of eye patterns of the PAM3 signals may be continuously performed.

Figure 15:
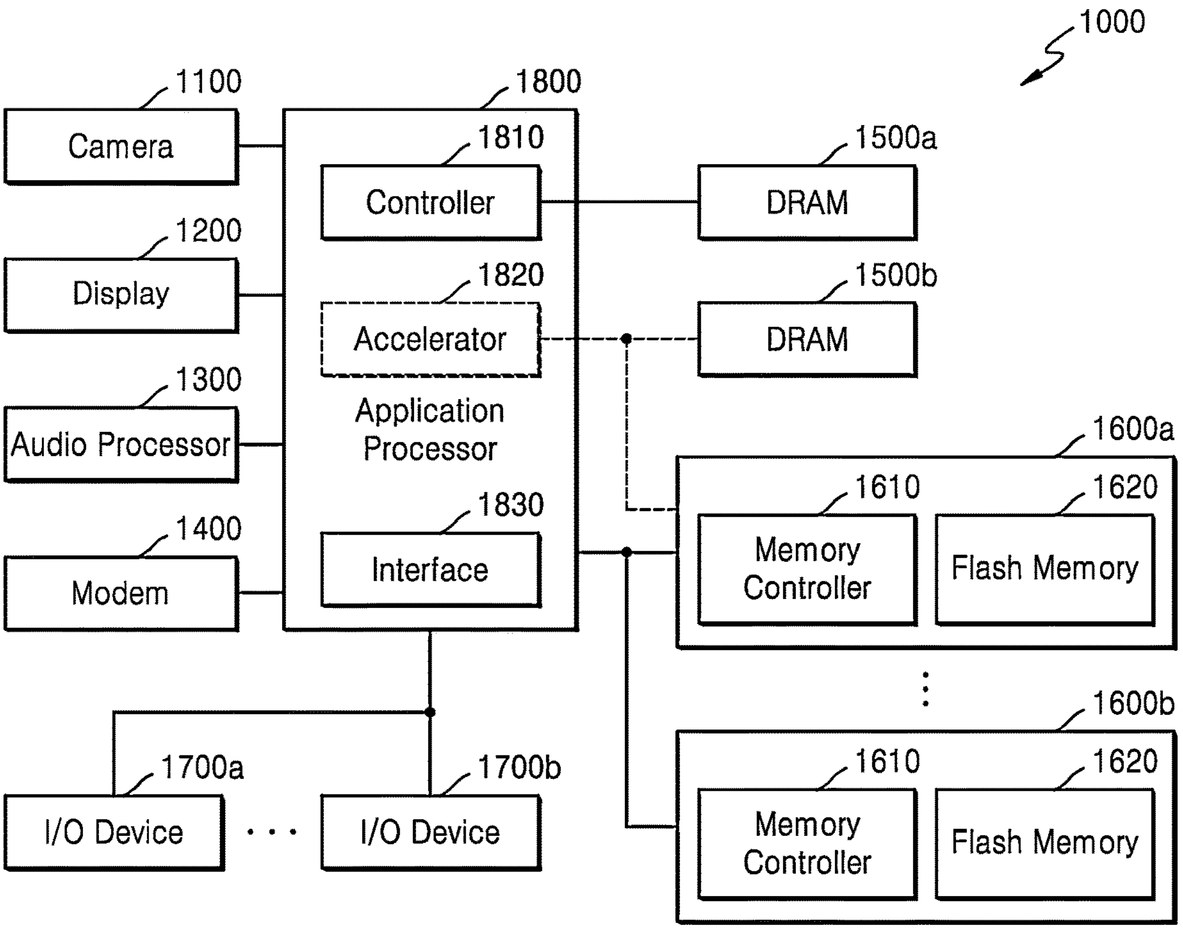
FIG. 15 is a block diagram illustrating a system including a memory device according to an embodiment.

FIG. 15 is a block diagram illustrating a system including a memory device according to an embodiment.

Referring to FIG. 15, a system 1000 may include a camera 1100, a display 1200, an audio processor 1300, a modem 1400, dynamic random access memory (DRAM) 1500*a* and 1500*b*, flash memory 1600*a* and 1600*b*, I/O devices 1700*a* and 1700*b*, and an application processor (hereinafter referred to as an "AP") 1800. The system 1000 may be implemented with smartphones, tablet personal computers (PCs), wearable devices, healthcare devices, or Internet of Things (IoT) devices. Also, the system 1000 may also be implemented with a server or a PC.

The camera 1100 may capture still images or moving images according to user's control and may store the captured images/image data or may transmit the stored images/image data to the display 1200. The audio processor 1300 may process audio data included in the flash memory 1600*a* and 1600*b* or contents of a network.

The modem 1400 may modulate and transmit signals for wired/wireless data transmission and reception and may demodulate the signals to restore their original signals at a reception side. The I/O devices 1700*a* and 1700*b* may include devices providing digital input and/or output functions such as a universal serial bus (USB) or storage, a digital camera, a secure digital (SD) card, a digital versatile disc (DVD), a network adapter, a touch screen, or the like.

The AP 1800 may control the overall operation of the system 1000. The AP 1800 may control the display 1200 so that part of contents stored in the flash memory 1600*a* and 1600*b* may be displayed on the display 1200. When user input is received by the I/O devices 1700*a* and 1700*b*, the AP 1800 may perform a control operation corresponding to the user input. The AP 1800 may include an accelerator block that is a dedicated circuit for artificial intelligence (AI) data operation, or may include an accelerator chip 1820 separately from the AP 1800. A DRAM 1500*b* may be additionally mounted on the accelerator block or accelerator chip 1820. The accelerator may be a functional block performing a specific function of the AP 1800, and include a graphics processing unit (GPU) that is a functional block performing graphics data processing, a neural processing unit (NPU) for performing AI calculation and inference, and a data processing unit (DPU) that is a block for data transmission.

The system 1000 may include a plurality of DRAMs 1500*a* and 1500*b*. The AP 1800 may control the DRAMs 1500*a* and 1500*b* through commands and mode register MRS settings suitable for joint electron device engineering council (JEDEC) standard specification, or may set DRAM interface regulations to use inherent functions, such as low voltage/high speed/reliability and cyclic redundancy check (CRC)/error correction code (ECC) functionality and may perform communications. For example, the AP 1800 may communicate with the DRAM 1500*a* through an interface suitable for JEDEC standard specifications and may set new DRAM interface regulations to control the accelerator DRAM 1500*b* having a higher bandwidth than the DRAM 1500*a* and may perform communications.

FIG. 15 illustrates only the DRAMs 1500*a* and 1500*b*. However, embodiments are not limited thereto, and any memory such as PRAM, SRAM, MRAM, RRAM, FRAM or hybrid RAM only when the bandwidths, response speed and voltage conditions of the AP 1800 or the accelerator chip 1820 are satisfied, may be available. The DRAMs 1500*a* and 1500*b* may have relatively small latency and bandwidth relative to the I/O devices 1700*a* and 1700*b* or the flash memory 1600 and 1600*b*. The DRAMs 1500A and 1500B may be initialized at the power on time of the system 1000, and the operating system and application data may be loaded to be used as a temporary storage place for the operating system and application data, or as an execution space of various software codes.

In the DRAMs 1500*a* and 1500*b*, add/subtract/multiply/division arithmetic operations, a vector operation, an address operation, or a fast Fourier transform (FFT) operation may be performed. In addition, within the DRAMs 1500*a* and 1500*b*, a function for the performance used in an inference operation may be performed. Here, inference may be performed in a deep learning algorithm using an artificial neural network. The deep learning algorithm may include an operation of training a model through various data and an interference operation of generating an inference or classification based on input data using the trained model. In an embodiment, images captured by the camera 1100 of the user may be signal-processed and stored in the DRAM 1500*b*, and the accelerator block or accelerator chip 1820 may perform an AI data operation of recognizing data by using the data stored in the DRAM 1500*b* and the function used to generate an inference therefrom.

The system 1000 may include a plurality of storage devices or a plurality of flash memory having a larger capacity than the DRAMs 1500*a* and 1500*b*. The accelerator block or the accelerator chip 1820 may perform the training operation and an AI data operation by using the flash memory 1600*a* and 1600*b*. In an embodiment, the flash memory 1600*a* and 1600*b* may perform the training operation performed by the AP 1800 and/or the accelerator chip 1820 and the interference AI data operation by using an arithmetic operation device provided in the memory controller 1610. The flash memory 1600*a* and 1600*b* may store photos captured by the camera 1100 or may store data transmitted via a data network. For example, the flash memory 1600*a* and 1600*b* may store augmented reality/virtual reality, high definition (HD) or ultra high definition (UHD) contents.

In the system 1000, the DRAMs 1500*a* and 1500*b* may include a PAM3 transmitter (10 of FIG. 1). The PAM3 transmitter may determine whether skew occurs in the eye patterns, by monitoring the eye opening height and the eye opening width of the PAM3 signals. The occurrence of the eye patterns may be seen by comparing the size of upper eye patterns of the PAM3 signals with the size of lower eye patterns of the PAM3 signals. When the size of the upper eye patterns of the PAM3 signals and the size of the lower eye patterns of the PAM3 signals are different from each other or asymmetric to each other, the PAM3 transmitter may adjust the duty cycle of the upper eye patterns and/or the lower eye patterns to output PAM3 signals of which upper eye patterns and lower eye patterns are enhanced.

As described above, embodiments have been disclosed in the drawings and the specification. Although the embodiments have been described using specific examples herein, this is used for the purpose of illustrating example embodiments of the present disclosure, and are not to be used to limit the scope of the present disclosure described in the claim. Thus, it will be understood by one of ordinary skill in the art that a variety of modifications and examples are possible therefrom. Therefore, the true technical protection scope of this disclosure should be determined by the scope of the attached claims.

While the inventive concept has been particularly shown and described with reference to embodiments thereof, it will be understood that various changes in form and details may be made therein without departing from the spirit and scope of the following claims.

What is claimed is:

1. A 3 level pulse amplitude modulation (PAM3) transmitter comprising:

a driver configured to convert input data into PAM3 signals;

an eye monitor circuit electrically connected to an output terminal of the driver and configured to monitor upper eye patterns and lower eye patterns of the PAM3 signals; and a duty cycle adjust circuit configured to adjust a duty cycle of the input data provided to the driver.

2. The PAM3 transmitter of claim 1, wherein the input data comprises serial data, the 3 level PAM3 transmitter further comprising:

a serializer configured to receive data and convert the received data into the serial data, wherein the duty cycle adjust circuit is further configured to receive pull-up enable signals and pull-down enable signals and adjust a duty cycle of the serial data in response to the pull-up enable signals and the pull-down enable signals.

3. The PAM3 transmitter of claim 2, wherein the duty cycle adjust circuit comprises:

a first transistor configured to receive the pull-up enable signals;

a second transistor configured to receive the pull-down enable signals; and a third transistor and a fourth transistor configured to receive the serial data output from the serializer.

4. The PAM3 transmitter of claim 3, wherein the duty cycle adjust circuit is further configured to adjust a rising edge of the serial data by adjusting a driving force of the first transistor based on the pull-up enable signals, and to adjust a falling edge of the serial data by adjusting a driving force of the second transistor based on the pull-down enable signals.

5. The PAM3 transmitter of claim 4, wherein the driving force of the first transistor is adjusted to move the rising edge of the serial data in a first direction on a time axis, and the driving force of the second transistor is adjusted to move the falling edge of the serial data in a second direction on the time axis to adjust the duty cycle of the input data.

6. The PAM3 transmitter of claim 5, wherein the driving force of the first transistor is adjusted to move the rising edge of the serial data in the second direction on the time axis, and the driving force of the second transistor is adjusted to move the falling edge of the serial data in the first direction on the time axis to adjust the duty cycle of the input data.

7. The PAM3 transmitter of claim 2, wherein the driver comprises:

a first transistor having a gate terminal configured to receive the input data and a first terminal configured to receive a power supply voltage; and a second transistor having a gate terminal configured to receive the input data and a first terminal configured to receive a ground voltage.

8. The PAM3 transmitter of claim 7, wherein the driver further comprises:

a first resistor electrically connected between a second terminal of the first transistor and a node configured to transfer one of the PAM3 signals; and a second resistor electrically connected between a second terminal of the second transistor and the node.

9. The PAM3 transmitter of claim 1, wherein the eye monitor circuit is further configured to generate duty cycle adjust signals and to provide the duty cycle adjust signals to the duty cycle adjust circuit when the upper eye patterns and the lower eye patterns of the PAM3 signals are asymmetric to each other.

10. The PAM3 transmitter of claim 1, wherein the eye monitor circuit is further configured to compare a size of the upper eye patterns with a size of the lower eye patterns and to generate duty cycle adjust signals for the input data based on the comparison.

11. The PAM3 transmitter of claim 10, wherein the duty cycle adjust circuit is further configured to receive the duty cycle adjust signals and to adjust a duty cycle of the input data provided to the driver.

12. A 3 level pulse amplitude modulation (PAM3) transmitter comprising:

a serializer configured to receive data and to convert the received data into serial data, a duty cycle adjust circuit configured to receive pull-up enable signals, pull-down enable signals, and the serial data and to output input data in response thereto;

a driver configured to convert the input data into PAM3 signals; and an eye monitor circuit electrically connected to an output terminal of the driver and configured to monitor upper eye patterns and lower eye patterns of the PAM3 signals and to generate duty cycle adjust signals in response thereto, wherein the duty cycle adjust circuit is configured to output the input data of which a duty cycle is adjusted, based on the duty cycle adjust signals.

13. The PAM3 transmitter of claim 12, wherein the duty cycle adjust circuit comprises:

a first transistor configured to receive the pull-up enable signals;

a second transistor configured to receive the pull-down enable signals; and a third transistor and a fourth transistor configured to receive the serial data generated by the serializer, wherein the first transistor and the third transistor comprise P-channel metal oxide semiconductor (PMOS) transistors, and the second transistor and the fourth transistor comprise N-channel MOS (NMOS) transistors.

14. The PAM3 transmitter of claim 13, wherein the duty cycle adjust circuit is further configured to adjust a driving force of the first transistor to move a rising edge of the input data in a first direction on a time axis, thereby adjusting a duty cycle of the input data, and to adjust a driving force of the second transistor to move a falling edge of the input data in a second direction on the time axis, thereby adjusting the duty cycle of the input data.

15. The PAM3 transmitter of claim 12, wherein the driver comprises:

a first transistor having a gate terminal configured to receive the input data and a first terminal configured to receive a power supply voltage;

a second transistor having a gate terminal configured to receive the input data and a first terminal configured to receive a ground voltage; and a first resistor electrically connected between a second terminal of the first transistor and a node configured to transfer one of the PAM3 signals; and a second resistor electrically connected between a second terminal of the second transistor and the node, and wherein the first transistor comprises a PMOS transistor, and the second transistor comprises a NMOS transistor.

16. The PAM3 transmitter of claim 12, wherein the eye monitor circuit is further configured to compare a size of the upper eye patterns with a size of the lower eye patterns and to generate duty cycle adjust signals for adjusting a duty cycle of the input data based on the comparison, and the duty cycle adjust circuit is further configured to receive the duty cycle adjust signals and to adjust a duty cycle of the input data in response thereto.

17. The PAM3 transmitter of claim 12, wherein the eye monitor circuit is further configured to generate duty cycle adjust signals and to provide the duty cycle adjust signals to the duty cycle adjust circuit when the upper eye patterns and the lower eye patterns of the PAM3 signals are asymmetric to each other.

18. An operating method of a 3 level pulse amplitude modulation (PAM3) transmitter, the operating method comprising:

receiving data and converting the received data into input data that comprises serial data;

converting the input data into PAM3 signals;

monitoring upper eye patterns and lower eye patterns of the PAM3 signals;

determining whether the upper eye patterns and the lower eye patterns of the PAM3 signals are asymmetric to each other; and adjusting a duty cycle of the input data based on whether the upper eye patterns and the lower eye patterns of the PAM3 signals are asymmetric to each other.

19. The operating method of claim 18, wherein the adjusting of the duty cycle of the input data comprises adjusting the duty cycle of the input data by moving a falling edge of the input data right on a time axis and by moving a rising edge of the input data left on the time axis.

20. The operating method of claim 18, wherein the adjusting of the duty cycle of the input data comprises adjusting the duty cycle of the input data by moving a falling edge of the input data left on a time axis and by moving a rising edge of the input data right on the time axis.

* * * * *